(12) United States Patent
Calvet et al.

(10) Patent No.: US 8,941,192 B2
(45) Date of Patent: Jan. 27, 2015

(54) MEMS ACTUATOR DEVICE DEPLOYMENT

(75) Inventors: Robert J. Calvet, Pasadena, CA (US); Xiaolei Liu, Los Angeles, CA (US); Ankur Jain, Arcadia, CA (US); Lakshminarayan Hariharan, Glendora, CA (US); Roman C. Gutierrez, Arcadia, CA (US)

(73) Assignee: DigitalOptics Corporation MEMS, Arcadia, CA (US)

(*) Notice: Subject to any disclaimer, the term of this patent is extended or adjusted under 35 U.S.C. 154(b) by 585 days.

(21) Appl. No.: 13/247,888

(22) Filed: Sep. 28, 2011

(65) Prior Publication Data

US 2012/0081598 A1 Apr. 5, 2012

Related U.S. Application Data

(63) Continuation-in-part of application No. 12/946,670, filed on Nov. 15, 2010, and a continuation-in-part of application No. 12/946,657, filed on Nov. 15, 2010, now Pat. No. 8,608,393, and a continuation-in-part of application No. 12/946,646, filed on Nov. 15, 2010, now Pat. No. 8,430,580.

(51) Int. Cl.
*H02N 1/00* (2006.01)
*G03B 17/00* (2006.01)
(Continued)

(52) U.S. Cl.
CPC .............. *G03B 5/00* (2013.01); *B81B 3/0037* (2013.01); *G03B 3/10* (2013.01); *B81B 2201/033* (2013.01); *B81B 2203/053* (2013.01); *G03B 2205/0007* (2013.01); *G03B 2205/0084* (2013.01)
USPC ........... 257/415; 310/300; 310/309; 396/529; 438/50

(58) Field of Classification Search
USPC ............. 310/309, 300; 428/50; 257/415, 417; 73/514.18, 514.32
See application file for complete search history.

(56) References Cited

U.S. PATENT DOCUMENTS

| | | |
|---|---|---|
| 2,774,001 A | 12/1956 | Riedel |
| 4,333,722 A | 6/1982 | Lee |

(Continued)

FOREIGN PATENT DOCUMENTS

| | | |
|---|---|---|
| EP | 1855145 | 11/2007 |
| EP | 1959284 | 8/2008 |

(Continued)

OTHER PUBLICATIONS

PCT/US 06/07024 Search Report of Nov. 28, 2007.
(Continued)

*Primary Examiner* — Burton Mullins
(74) *Attorney, Agent, or Firm* — Haynes and Boone, LLP

(57) ABSTRACT

A method for making an actuator device includes forming a substantially planar structure having a stage resiliently supported for movement within a plane of the structure, an actuator coupled to an outer periphery of the stage and operable to apply a force acting in the plane and tangentially to the stage when actuated, the actuator comprising a fixed frame and a moving frame resiliently supported for reciprocal movement relative to the fixed frame by a motion control flexure, and an outer frame surrounding and supporting the stage and the actuator. The moving frame is moved to a deployed position that is coplanar with, parallel to and spaced apart from the fixed frame at a selected distance, and the moving frame is then fixed at the deployed position for substantially rectilinear, perpendicular movement relative to the fixed frame.

21 Claims, 21 Drawing Sheets

(51) Int. Cl.
*G03B 5/00* (2006.01)
*B81B 3/00* (2006.01)
*G03B 3/10* (2006.01)

(56) References Cited

U.S. PATENT DOCUMENTS

| | | | |
|---|---|---|---|
| 4,384,778 A | 5/1983 | Lee et al. | |
| 4,408,857 A | 10/1983 | Frank | |
| 4,496,217 A | 1/1985 | Aoyagi | |
| 4,716,432 A | 12/1987 | Stephany | |
| 4,860,040 A | 8/1989 | Tamamura et al. | |
| 5,150,260 A | 9/1992 | Chigira | |
| 5,386,294 A | 1/1995 | Ototake et al. | |
| 5,699,621 A | 12/1997 | Trumper et al. | |
| 5,825,560 A | 10/1998 | Ogura et al. | |
| 5,867,302 A | 2/1999 | Fleming | |
| 5,986,826 A | 11/1999 | Kosaka et al. | |
| 5,995,688 A | 11/1999 | Aksyuk et al. | |
| 6,033,131 A | 3/2000 | Ghosh | |
| 6,068,801 A | 5/2000 | Bodo et al. | |
| 6,205,267 B1 | 3/2001 | Aksyuk et al. | |
| 6,239,473 B1 | 5/2001 | Adams | |
| 6,262,827 B1 | 7/2001 | Ueda et al. | |
| 6,291,875 B1 | 9/2001 | Clark | |
| 6,392,703 B1 | 5/2002 | Uchino et al. | |
| 6,426,777 B1 | 7/2002 | Sato | |
| 6,497,141 B1 | 12/2002 | Turner et al. | |
| 6,535,311 B1 | 3/2003 | Lindquist | |
| 6,675,671 B1 | 1/2004 | Jokiel, Jr. et al. | |
| 6,679,055 B1 | 1/2004 | Ellis | |
| 6,806,991 B1 | 10/2004 | Sarkar | |
| 6,845,669 B2 * | 1/2005 | Acar et al. | 73/504.14 |
| 6,847,907 B1 | 1/2005 | Novotny | |
| 6,850,675 B1 | 2/2005 | Calvet et al. | |
| 6,914,635 B2 | 7/2005 | Ostergard | |
| 6,950,570 B1 | 9/2005 | Novotny | |
| 6,958,777 B1 | 10/2005 | Pine | |
| 7,027,206 B2 | 4/2006 | Mochizuki | |
| 7,038,150 B1 | 5/2006 | Polosky et al. | |
| 7,113,688 B2 | 9/2006 | Calvet et al. | |
| 7,148,603 B1 | 12/2006 | Garcia et al. | |
| 7,154,199 B2 | 12/2006 | Yasuda | |
| 7,190,854 B1 | 3/2007 | Novotny | |
| 7,266,272 B1 | 9/2007 | Calvet et al. | |
| 7,279,761 B2 * | 10/2007 | Acar et al. | 257/415 |
| 7,285,879 B2 | 10/2007 | Osaka | |
| 7,359,131 B1 | 4/2008 | Gutierrez et al. | |
| 7,372,074 B2 | 5/2008 | Milne et al. | |
| 7,436,207 B2 | 10/2008 | Rogers et al. | |
| 7,477,842 B2 | 1/2009 | Gutierrez | |
| 7,545,591 B1 | 6/2009 | Tong et al. | |
| 7,555,210 B2 | 6/2009 | Calvet | |
| 7,557,470 B2 | 7/2009 | Culpepper et al. | |
| 7,579,848 B2 | 8/2009 | Bottoms et al. | |
| 7,586,702 B1 | 9/2009 | Huang et al. | |
| 7,645,627 B2 | 1/2010 | Christenson | |
| 7,646,969 B2 | 1/2010 | Calvet et al. | |
| 7,705,909 B2 | 4/2010 | Ishizawa et al. | |
| 7,720,366 B2 | 5/2010 | Iwasaki et al. | |
| 7,838,322 B1 | 11/2010 | Vargo | |
| 7,855,489 B2 | 12/2010 | Hirano | |
| 7,872,394 B1 | 1/2011 | Gritters et al. | |
| 7,990,628 B1 | 8/2011 | Calvet et al. | |
| 8,004,780 B2 | 8/2011 | Gutierrez et al. | |
| 8,178,936 B2 | 5/2012 | Zhe et al. | |
| 8,299,598 B2 | 10/2012 | Moden | |
| 2001/0004420 A1 | 6/2001 | Kuwana et al. | |
| 2002/0006687 A1 | 1/2002 | Lam | |
| 2002/0070634 A1 | 6/2002 | Tai et al. | |
| 2002/0105699 A1 | 8/2002 | Miracky et al. | |
| 2002/0125789 A1 | 9/2002 | Brandt | |
| 2002/0130586 A1 | 9/2002 | Mao | |
| 2003/0026547 A1 | 2/2003 | Trzecieski | |
| 2003/0048036 A1 | 3/2003 | Lemkin | |
| 2003/0062422 A1 | 4/2003 | Fateley et al. | |
| 2003/0063838 A1 | 4/2003 | Hagood | |
| 2003/0076421 A1 | 4/2003 | Dutta | |
| 2003/0086751 A1 | 5/2003 | Culpepper | |
| 2003/0210116 A1 | 11/2003 | Lane et al. | |
| 2004/0017620 A1 | 1/2004 | Kaneko et al. | |
| 2004/0048410 A1 | 3/2004 | O'Brien et al. | |
| 2004/0066494 A1 | 4/2004 | Lee et al. | |
| 2004/0136680 A1 | 7/2004 | Medina | |
| 2004/0183936 A1 | 9/2004 | Kim et al. | |
| 2004/0184132 A1 | 9/2004 | Novotny | |
| 2004/0189969 A1 | 9/2004 | Mizuno | |
| 2004/0201773 A1 | 10/2004 | Ostergard | |
| 2005/0000311 A1 | 1/2005 | Storm | |
| 2005/0002008 A1 | 1/2005 | De Weerdt et al. | |
| 2005/0002086 A1 | 1/2005 | Starkweather et al. | |
| 2005/0007489 A1 | 1/2005 | Ahn et al. | |
| 2005/0095813 A1 | 5/2005 | Zhu et al. | |
| 2005/0139542 A1 | 6/2005 | Dickensheets et al. | |
| 2005/0156481 A1 | 7/2005 | Zhou et al. | |
| 2005/0219399 A1 | 10/2005 | Sato et al. | |
| 2005/0249487 A1 | 11/2005 | Gutierrez | |
| 2006/0028320 A1 | 2/2006 | Osaka | |
| 2006/0033938 A1 | 2/2006 | Kopf et al. | |
| 2006/0056084 A1 | 3/2006 | Araki | |
| 2006/0092514 A1 | 5/2006 | Koo | |
| 2006/0153556 A1 | 7/2006 | Lee et al. | |
| 2006/0183332 A1 | 8/2006 | Kang | |
| 2006/0192858 A1 | 8/2006 | Calvet | |
| 2006/0193618 A1 | 8/2006 | Calvet | |
| 2006/0204242 A1 | 9/2006 | Gutierrez et al. | |
| 2006/0209012 A1 | 9/2006 | Hagood | |
| 2006/0219006 A1 | 10/2006 | Nasiri et al. | |
| 2006/0250325 A1 | 11/2006 | Hagood et al. | |
| 2006/0252297 A1 | 11/2006 | Culpepper | |
| 2006/0277997 A1 | 12/2006 | Foster | |
| 2007/0024155 A1 | 2/2007 | Calvet | |
| 2007/0133976 A1 | 6/2007 | Gutierrez | |
| 2008/0020573 A1 | 1/2008 | Birkmeyer et al. | |
| 2008/0044172 A1 | 2/2008 | Tang et al. | |
| 2008/0054757 A1 | 3/2008 | Aksyuk | |
| 2008/0198249 A1 | 8/2008 | Tanimura et al. | |
| 2008/0240704 A1 | 10/2008 | Takahashi | |
| 2008/0279498 A1 | 11/2008 | Sampsell et al. | |
| 2008/0309191 A1 | 12/2008 | Chou | |
| 2009/0031548 A1 | 2/2009 | Zaitsu | |
| 2009/0185796 A1 | 7/2009 | Tsutsumi et al. | |
| 2009/0213236 A1 | 8/2009 | Chiou | |
| 2009/0244302 A1 | 10/2009 | Tsai | |
| 2009/0244668 A1 | 10/2009 | Fujino | |
| 2009/0284816 A1 | 11/2009 | Davis | |
| 2009/0310959 A1 | 12/2009 | Shih et al. | |
| 2010/0232777 A1 | 9/2010 | Tseng et al. | |
| 2010/0284081 A1 | 11/2010 | Gutierrez et al. | |
| 2011/0026148 A1 | 2/2011 | Tanimura et al. | |
| 2012/0119614 A1 * | 5/2012 | Gutierrez | 310/300 |

FOREIGN PATENT DOCUMENTS

| | | |
|---|---|---|
| EP | 2264507 | 12/2010 |
| JP | 2006-297543 | 11/2006 |
| JP | 2008-010624 | 1/2008 |
| JP | 2010-145264 | 7/2010 |
| JP | 2010-167536 | 8/2010 |
| KR | 2008/0079115 | 8/2008 |
| WO | WO02/063371 | 8/2002 |
| WO | WO2008/061025 | 5/2008 |
| WO | WO2010/038229 | 4/2010 |

OTHER PUBLICATIONS

Akihiro Koga et al. "Electrostatic Linear Microactuator Mechanism for Focusing a CCD Camera"; Journal of Lightwave Technology, vol. 17, No. 1: p. 43-47; Jan. 1999.

Tsuboi, O. et al., "A Rotational Comb-Driven Micromirror with a Large Deflection Angle and Low Drive Voltage," Technical Digest. MEMS. IEEE International Conference on Microelectro Mechanical Systems, Jan. 20, 2002, pp. 532-535.

(56) References Cited

OTHER PUBLICATIONS

Yi, Chu, et al., "Design, Fabrication and Control of Components in MEMS-Based Optical Pickups," IEEE Transactions on Magnetics, IEEE Service Center, New York, US, vol. 17, No. 2, Feb. 1, 2007, pp. 780-784.

Minching, Wu, et al., "Development of Tracking and Focusing Micro Actuators for Dual-Stage Optical Pick-Up Head," Journal of Optics. A, Pure and Applied Optics, Institute of Physics Publishing, Bristol, GB, vol. 8, No. 7, Jul. 1, 2006, pp. S323-S329.

Seong-Hyok Kim, et al., Integrated Micro Optical Flying Head with Lens Positioning Actuator for Small Form Factor Data Storage, Transducers '03. $12^{th}$ International Conference on Solid-State Sensors, Actuators and Microsystems. Digest of Technical Papers (Cat. No. 03TH8664), vol. 1, Jan. 1, 2003, pp. 607-610.

Sunghoon, Kwon, et al., "Large Displacement Vertical Microlens Scanner wit Low Driving Voltage," IEEE Photonics Technology Letters, IEEE Service Center, Piscataway, NJ, US, vol. 14, No. 11, Nov. 1, 2002.

Takahashi, K., et al.; "Switched-Layer Design for SOI Bulk Micromachined XYZ Stage Using Stiction Bar for Interlayer Electrical Connection," Journal of Microelectromechanical Systems, IEEE Service Center, US, vol. 18, No. 4, pp. 818-827, Aug. 1, 2009.

\* cited by examiner

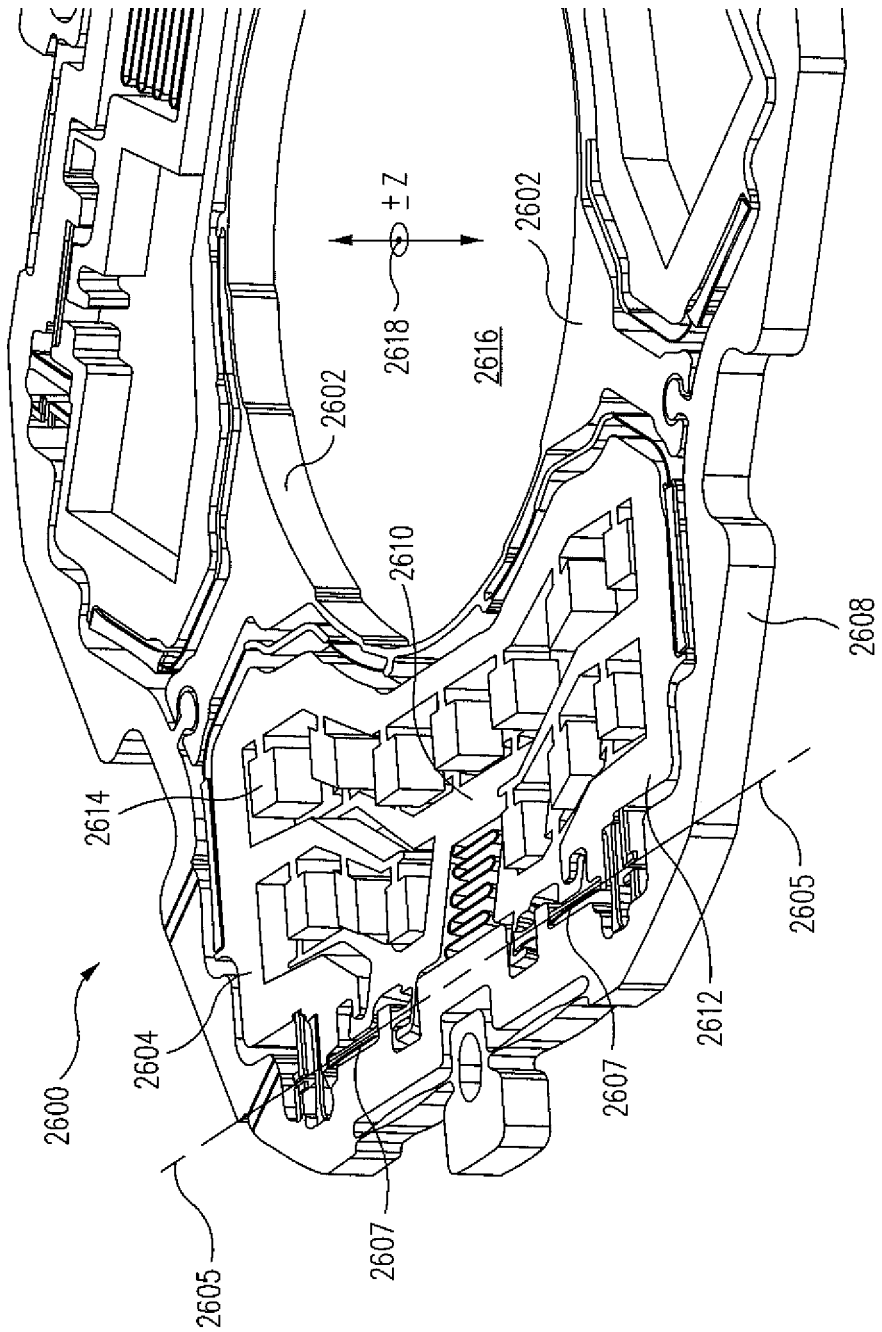

FIG. 30B

MEMS ACTUATOR DEVICE DEPLOYMENT

RELATED APPLICATIONS

This application is a continuation-in-part of U.S. patent application Ser. Nos. 12/946,670, 12/946,657, now U.S. Pat. No. 8,608,393, and Ser. No. 12/946,646, now U.S. Pat. No. 8,430,580, all filed Nov. 15, 2010 and incorporated herein by reference.

BACKGROUND

1. Technical Field

This disclosure relates, in general, to actuator devices that are useful in optical devices, for example, cameras, particularly miniature cameras and the like, to effect relative movement of optical elements, such as lenses, filters, image sensors and the like, so as to achieve desirable optical effects, such as, for example, optical image stabilization (OIS).

2. Related Art

Actuators for use in miniature cameras and other optical devices are relatively well known. Such actuator devices typically comprise voice coil or Lorentz actuators that are used, for example, to move a lens for focusing, zooming, or OIS.

Miniature cameras are frequently used in a variety of different electronic devices. For example, miniature cameras are commonly incorporated in cellular telephones, personal digital assistants (PDAs), laptop computers, and surveillance systems. Miniature cameras can also be used to advantage in many other applications, such as colonoscopy, arthroscopy and the like.

As the size and cost of electronic devices continue to shrink, it becomes necessary to achieve a concomitant reduction in the size and cost of the miniature camera components incorporated into such devices. In the past, this reduction in size and cost has meant that certain advanced features, such as focus, including autofocus, zoom and OIS capabilities typically found in larger, more advanced, and hence, more expensive cameras, must be omitted or provided in an attenuated form. The reason for this is due in large part to the larger size, complexity and cost of the actuators needed to effect relative movement of optical elements, such as lenses, image sensors and the like, in order to achieve such advanced effects.

Accordingly, a need exists for actuator devices for optical elements that are substantially smaller, simpler and less expensive than the prior art mechanisms, and yet which can be reliably implemented in miniature camera systems to achieve the same or even improved advanced features of higher-end camera systems, such as OIS.

SUMMARY

In accordance with the present disclosure, actuator devices for optical elements are provided which are substantially smaller and simpler than prior art actuator mechanisms, and which can be reliably implemented in miniature camera systems to achieve, among others, the same or better advanced features of higher-end camera systems, and in particular, OIS.

In one embodiment, an actuator device comprises a substantially planar structure having a stage resiliently supported for movement within a plane of the structure, an actuator coupled to an outer periphery of the stage and operable to apply a force acting in the plane and tangentially to the stage when actuated, the actuator comprising a fixed frame and a moving frame resiliently supported for reciprocal movement relative to the fixed frame by a motion control flexure, and an outer frame surrounding and supporting the stage and the actuator.

A method for making the above actuator device includes moving the moving frame to a deployed position that is coplanar with, parallel to and spaced apart from the fixed frame at a selected distance, and then fixing the moving frame at the deployed position for substantially rectilinear, perpendicular movement relative to the fixed frame.

In another embodiment, an actuator device comprises a substantially planar structure having a stage resiliently supported for both in-plane and out-of-plane movement relative to a plane of the device. An actuator is coupled to an outer periphery of the stage, the actuator comprising an out-of-plane portion operable to apply a force acting perpendicular to the plane of the device and the stage when actuated, the out-of-plane portion including an out-of-plane fixed frame and an out-of-plane moving frame coupled to the stage and resiliently supported for rotational movement relative to the out-of-plane fixed frame. The actuator further includes an in-plane portion operable to apply a force acting in the plane of the device and tangentially to the stage when actuated, the in-plane portion including an in-plane fixed frame and an in-plane moving frame coupled to the out-of-plane fixed frame and resiliently supported for translational movement relative to the in-plane fixed frame. An outer frame surrounds and supports the stage and the actuator.

This actuator device can be deployed by rotating the out-of-plane fixed frame or the out-of-plane moving frame to a deployed position disposed at a selected angular position relative to the other out-of-plane frame, translating the in-plane moving frame to a deployed position that is coplanar with and spaced a selected distance apart from the in-plane fixed frame, and fixing the deployed out-of-plane and in-plane frames at their respective deployed positions.

A better understanding of the above and many other features and advantages of the novel actuator devices of the present disclosure and the several methods of their manufacture and deployment for use can be obtained from a consideration of the detailed description of some example embodiments thereof below, particularly if such consideration is made in conjunction with the figures of the appended drawings, wherein like reference numerals are used to identify like elements illustrated in one or more of the figures.

BRIEF DESCRIPTION OF THE FIGURES OF THE DRAWINGS

FIG. 27 is a partial perspective view of the example actuator device of FIG. 26;

FIGS. 30A-30C are partial schematic side elevation views of an example rotational deployment latching mechanism for an actuator device in accordance with the present disclosure, respectively showing successive steps involved in the deployment and latching thereof;

DETAILED DESCRIPTION

In the present disclosure, actuator devices are described that are useful for in-plane, out-of-plane, and both in-plane and out-of-plane actuation of, for example, optical elements of miniature cameras, together with methods for making and deploying them for operational use.

Figure 1:
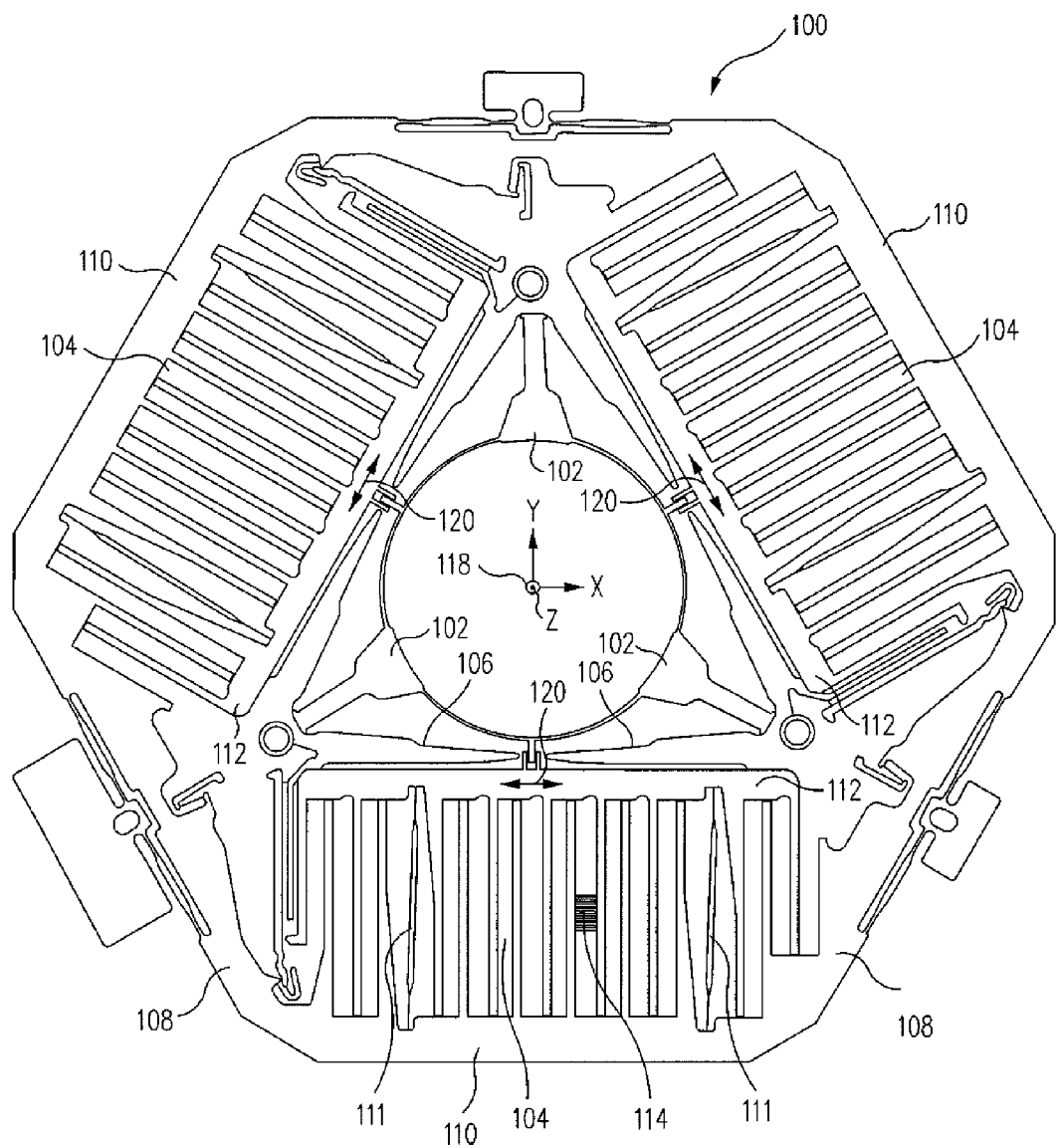
FIG. 1 is a plan view of an example embodiment of an in-plane actuator device in accordance with the present disclosure.

An example of an actuator device 100 adapted to effect movement of an optical element, such as a lens, lens group or an imaging sensor, in a focal plane, i.e., an X-Y plane orthogonal to an optical or Z axis, of a camera, is illustrated in the plan view of FIG. 1 and described in detail in commonly owned U.S. patent application Ser. No. 13/247,895, filed Sep. 28, 2011 and incorporated herein by reference. As illustrated in FIG. 1, in some embodiments, the generally planar actuator device 100 can comprise a stage 102 resiliently supported for movement within a plane of the device 100, three or more actuators 104, each coupled to an outer periphery of the stage 102 through at least one flexure 106 and operable to apply a force acting in the plane of and tangentially to the stage 102 when actuated, and an outer frame 108 surrounding and supporting the stage 104 and the actuators 104 during operation. In the particular example embodiment illustrated in the figures, the device 100 incorporates three actuators 104, but in other embodiments, a greater number of actuators 104 can be used. Additionally, although the actuators 104 in the figure are shown arranged at equal angular intervals around the periphery of the stage 102, viz., at 120 degree intervals, other, even irregular, angular arrangements of the actuators 104 are possible.

Figure 1A:
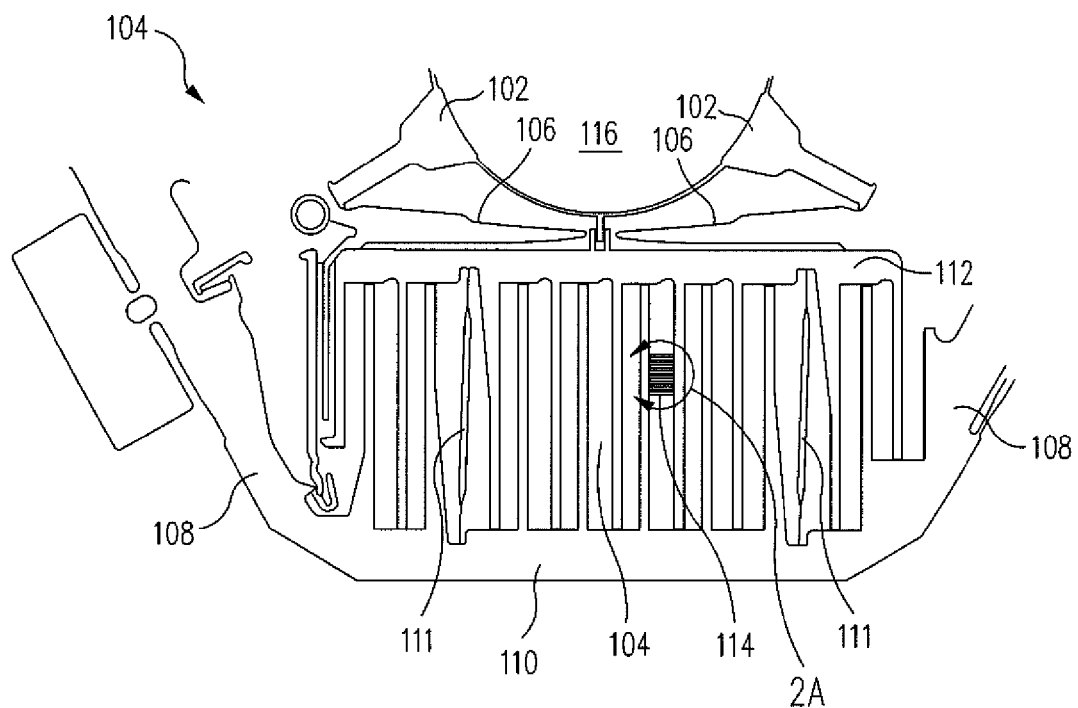
FIG. 1A is a partial plan view of an actuator of the example actuator device of FIG. 1, showing the actuator in an as-fabricated state and before being deployed for operational use.
Figure 1B:
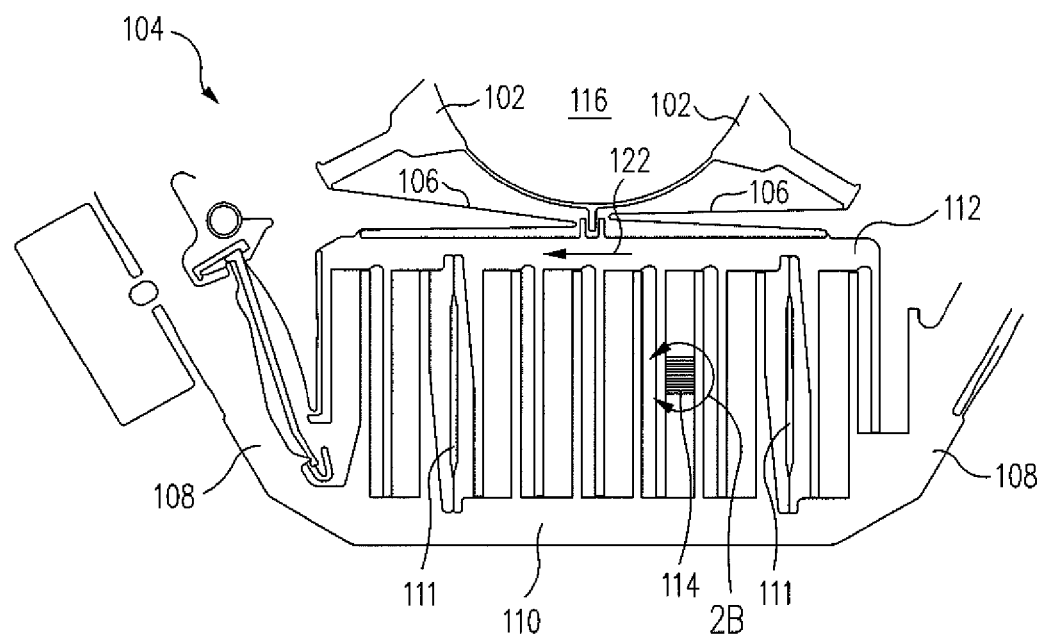
FIG. 1B is a partial plan view of the actuator of FIG. 1A, showing the actuator after deployment thereof.

As illustrated in FIGS. 1, 1A and 1B, in some embodiments, the X-Y plane actuator device 100 can comprise a micro electromechanical systems (MEMS) structure that can be fabricated as a single, integral structure from a substrate of, for example, silicon, using well-known micromachining and/or photolithography techniques, and the actuators 104 can comprise, for example, electrostatic "comb drive" actuators, each comprising a fixed frame 110, a moving frame 112 resiliently supported for reciprocal, rectilinear movement relative to the fixed frame 110 by one or more motion control flexures 111, and a plurality of interdigitated teeth 114 (see FIGS. 2A-2C) alternately attached to the fixed and the moving frames 110 and 112.

As further illustrated in FIG. 1, in some embodiments, the stage 102 can incorporate a central opening 116 defining, e.g., a "lens ring" having a center or centroid 118, and within which, for example, a lens or group of lenses (a "lens group"), or another type of optical element can be concentrically mounted. Alternatively, the central opening 116 in the stage 102 can be omitted, such that the stage 102 defines a moving platform upon which, for example, an imaging sensor, such as a CMOS or CCD integrated circuit (IC) imaging sensor, e.g., a "camera-on-a-chip," can be mounted.

As can be seen in FIG. 1, the moving frame 112 of each actuator 104 is coupled to the stage 102 by a bilaterally symmetrical pair of "leaf springs," or recurvate flexures 106. The flexures 106 are relatively stiff in the Z direction, i.e., in a direction perpendicular to the plane of the device 100 and stage 102, but resiliently flexible in the X and Y directions, i.e., they couple tangential motion of the associated actuator 104 to the stage 102 in a relatively stiff manner, while at the same time, are very compliant in the radial direction, thereby forming a "pseudo-kinematic" coupling arrangement between the actuators 104 and the stage 102.

Figure 2A:
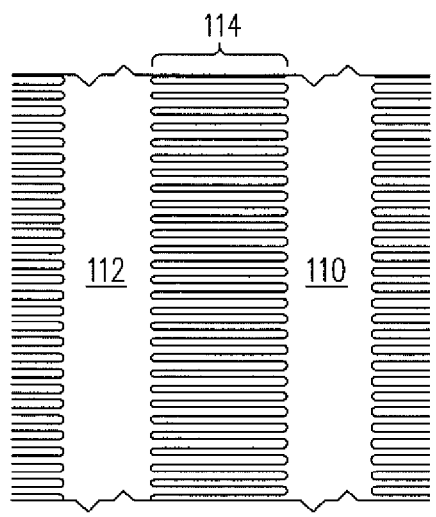
FIG. 2A is a partial plan view of the fixed and moving teeth of the actuator of FIG. 1A, showing the teeth before the actuator is deployed for operational use.
Figure 2B:
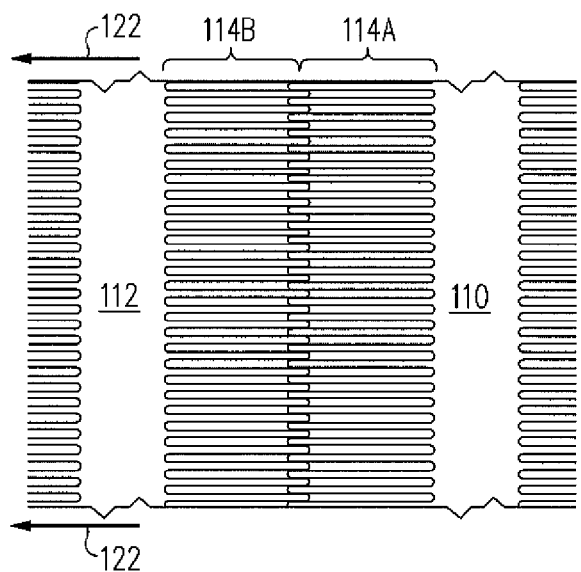
FIG. 2B is a partial plan view of the fixed and moving teeth of the actuator of FIG. 1B, showing the teeth after the actuator has been deployed.
Figure 2C:
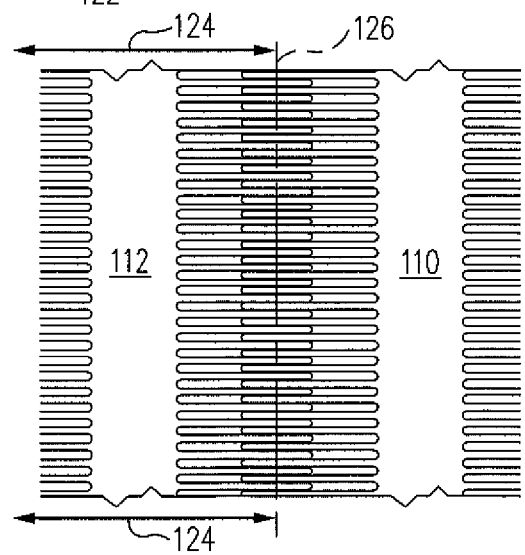
FIG. 2C is a partial plan view of the fixed and moving teeth of the deployed actuator of FIG. 1B, after a moving frame and a moving portion of the teeth have been biased to an operating position.

Additionally, as may be seen in the enlarged detail views of FIGS. 2A-2C, the interdigitated teeth 114 of the comb drive actuators 104, which are alternately coupled to the respective fixed and moving frames 110 and 112 of the actuators 104, are oriented for reciprocal movement relative to each other in a tangential direction relative to the stage 102, as indicated by the double-headed arrows 120 in FIGS. 1 and 2C, in response to the application of a voltage differential to, or its removal from, the fixed and moving frames 110, 112 and their respective fixed and moving teeth 114A and 114B. As described in more detail in U.S. application Ser. No. 13/247,895 above, this arrangement can result in an actuator device 100 in which, by appropriate individual actuation of each of the actuators 104, the stage 102, and hence, an optical element coupled to the stage 102 for conjoint movement therewith, such as a lens, can be made to move with three degrees of movement in a plane, e.g., an X-Y or focal plane of a camera, with pure translational and/or pure rotational movement therein, that is, with ±X, ±Y and/or ±θ$_z$ movement in that plane. A description of an example controller for effecting OIS in a camera using an embodiment of the actuator device 100 described herein can be found in commonly owned U.S. patent application Ser. No. 13/247,906, filed Sep. 28, 2011, and incorporated herein by reference.

In some embodiments, in order to minimize the size of the actuators 104 while at the same time maximizing the length of travel of the fixed and moving teeth 114A and 114B relative to each other, the actuator device 100 can be fabricated such that, in the as-fabricated state, the interdigitated fixed and moving teeth 114A and 114B of the actuators 104 are disposed immediately adjacent to each other, i.e., with little or no spacing between the respective ends of the teeth 114 and the opposing fixed or moving frame 110, 112, as illustrated in the enlarged detail view of FIG. 2A. As those of some skill in this art will appreciate, in this condition, the application of a voltage differential to the interdigitated teeth 114 of the actuators 104 would not result in any desired movement of the moving frame 112 relative to the fixed frame 110.

Accordingly, as illustrated in FIGS. 1A and 2B, prior to operation of such actuator devices 100, the moving frame 112 of each actuator 104 can be "deployed" laterally with respect to the fixed frame 110, as indicated by the arrow 122 in FIG. 2B, to a position that is coplanar with, parallel to, and spaced at a selected distance apart from the associated fixed frame 110 for substantially coplanar, rectilinear, reciprocal movement relative to the associated fixed frame 110, and then fixed or latched in that deployed position. As discussed in more detail below, there are several different methods and apparatus for moving the moving frame 112, and hence, the associated moving portion of the teeth 114B, of an actuator 104 to the deployed position, as well as for latching or fixing it in the deployed position. Thus, FIGS. 1A and 2A respectively illustrate an example actuator 104 and the associated teeth 114 thereof in the un-deployed state, and FIGS. 1B and 2B respectively illustrate the actuator 104 and its teeth 114 disposed in the deployed state.

As discussed in more detail in commonly owned U.S. application Ser. No. 13/247,895 above and illustrated in FIGS. 1B and 2B herein, in some embodiments, when the actuators 104 have been deployed but no actuation voltages are being applied to them, the deployed position of the moving frames 112 relative to the fixed frames 110 can define a "beginning-of travel," "power-off" or "parked" state of the actuators 104, in which the centroid 118 of the stage 102 remains centered within the actuator device 100. As illustrated in FIG. 2C, by the application of a suitable voltage differential to the fixed and moving teeth 114A and 114B, the actuators 104 can then all be biased to a "half-travel" or "operating" position, as indicated by the phantom line 126 in FIG. 2C. Thereafter, an increase in the bias voltage on a given actuator 104 will result in a tangential movement of its moving frame 112 away from the biased position 126 and toward the associated fixed frame 110 thereof, and conversely, a decrease in the bias voltage will result in a tangential movement of its moving frame 112 away from the biased position 126 and the fixed frame 110, as indicated by the double-headed arrows 124 in FIG. 2C. As will be appreciated, removal of all voltages from the actuator 104 will result in the moving frame 110 returning to its original, beginning-of-travel or power-off or parked position, as illustrated in FIG. 2B.

As discussed above, there are several different methods and apparatus for moving the moving frame 112, and hence, the associated moving portion of the teeth 114B, of an actuator 104 to the deployed position, as well as for latching or fixing it in the deployed position.

Figure 3:
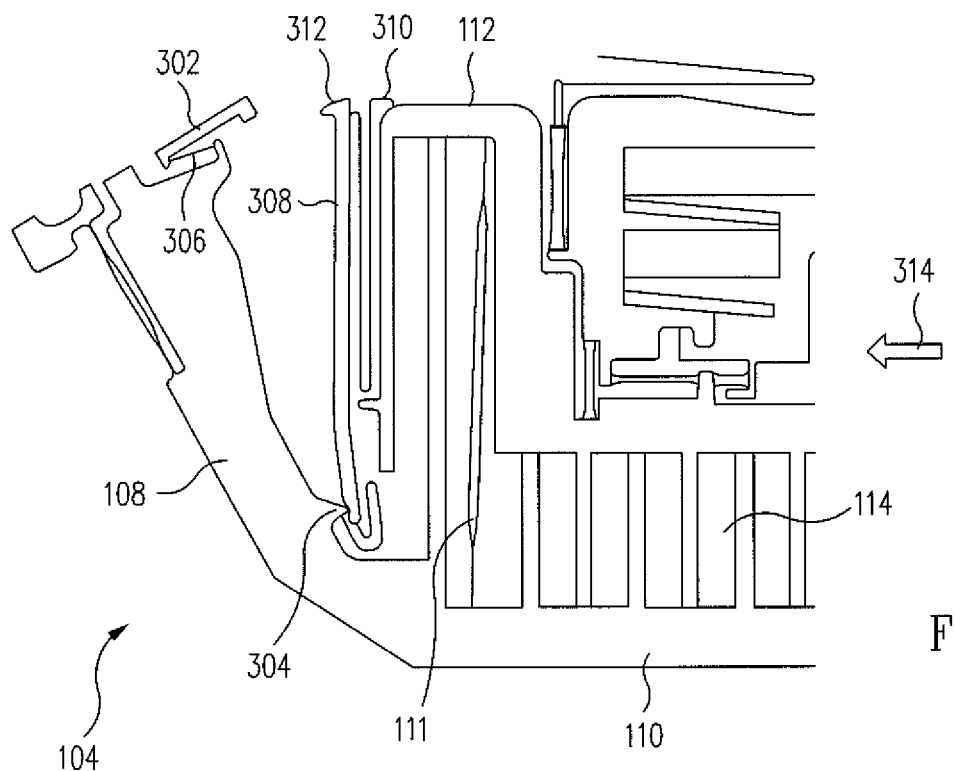
FIG. 3 is a partial plan view of an actuator device, showing an example method for deploying the actuator device in accordance with the present disclosure.

An example embodiment of one such method and apparatus is illustrated in the enlarged partial top plan view of an actuator 104 in FIG. 3. In the embodiment of FIG. 3, the deployment method includes forming a coplanar over-center latch 302 and a fulcrum 304 on the outer frame 108. The latch 302 is coupled to the outer frame 108 with a spring 306. A co-planar deployment lever 308 is coupled to the moving frame 112 with a deployment flexure 310, i.e., a flexure used primarily in the actuator deployment process. The moving frame 112 is, in turn, coupled to the fixed frame 108 by a motion control flexure 111, i.e., a flexure used primarily to control the motion of the moving frame 112 relative to the fixed frame 110. The deployment lever 308 has a surface 312 disposed at an upper end of the lever that is configured as an inclined plane for a camming actuation of and a latching engagement with the latch 302, and a notch at a lower end of the lever that is engaged with the fulcrum 304 for rotational movement of the lever thereabout.

In an example deployment, an acceleration force, e.g., one as might be effected by the weight of the moving frame 112 by a gravitational field acting thereon, is applied to the actuator device 100 in the direction of the arrow 314 while holding the outer frame 108 fixed. This causes the deployment lever 308 to rotate about the fulcrum 404 and toward the outer frame 108. The rotation of the deployment lever 308 about the fulcrum 304 causes the deployment flexure 310 to urge the moving frame 112 leftward away from the fixed frame 110 and to the deployed position, where the camming surface 312 at the upper end of the deployment lever 308 actuates and is engaged by the latch 302 so as to fix the moving frame 112 and associated moving teeth 114B in the deployed position, as illustrated in, e.g., FIGS. 1B and 2B.

Figure 4:
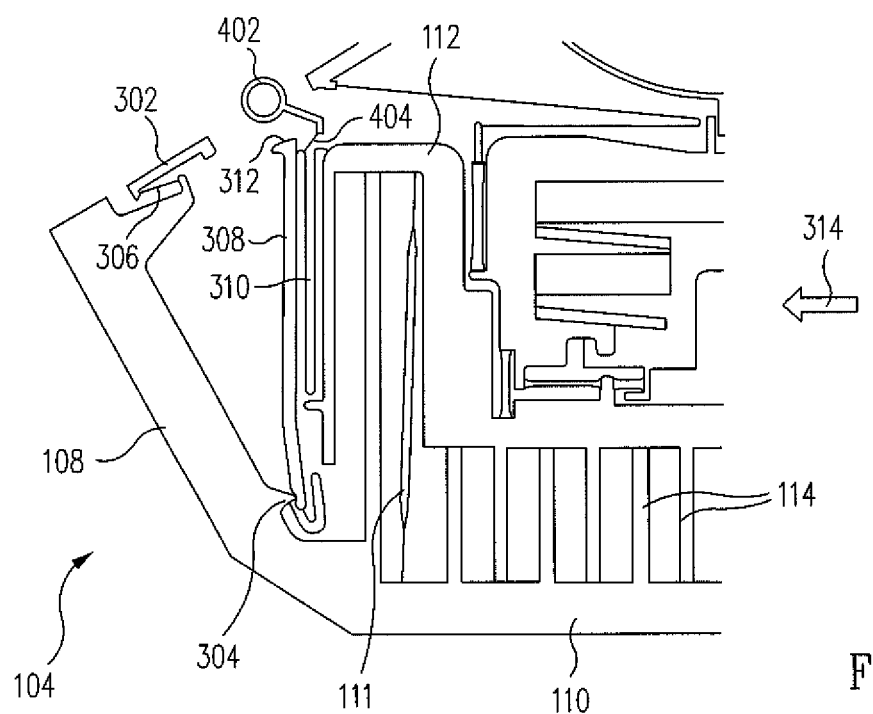
FIG. 4 is a partial plan view of an actuator device, showing another example method for deploying the device in accordance with the present disclosure.

FIG. 4 illustrates another example embodiment of method and apparatus for deploying and latching the actuators 104 of an actuator device 100 that is similar to those of the embodiment of FIG. 3. In this embodiment, the method further includes forming a pull ring 402 attached to the deployment flexure 312 by a spring 404 disposed adjacent to the upper end of the deployment lever 308, and then using the pull ring 402 to rotate the deployment lever 308 about the fulcrum 304 manually using, e.g., a small needle or another MEMS device inserted into the pull ring 402.

Figure 5:
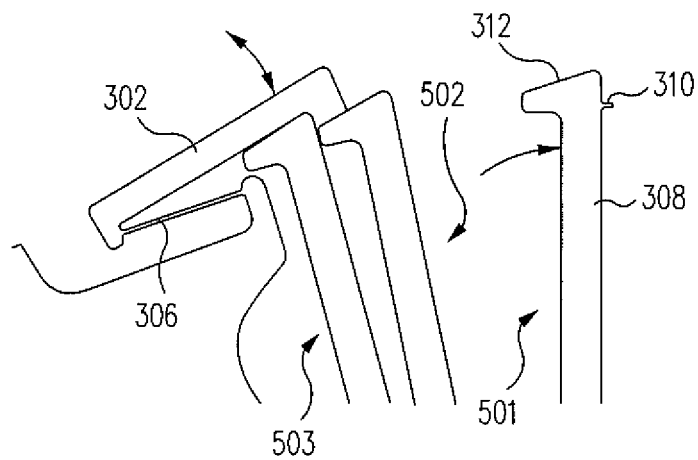
FIG. 5 is a partial plan view of an actuator device, showing another example method for deploying the device.

FIG. 5 is an enlarged partial plan view of the over-center latch 302 and deployment lever 308 of the embodiments of FIGS. 3 and 4, showing the deployment lever 308 disposed in its original, or pre-deployment position 502, in an intermediate position 504, in which the caroming surface 312 at the upper end of the lever 308 has engaged the latch 302 and forced it to rotate upward against the latch spring 306, and in a final or latched position 504, in which the latch 302 has been returned to its original position by the latch spring 306 and engaged over the upper end of the deployment lever 308, thereby latching it, and hence, the moving frame 112 and associated moving actuator teeth 114B, in the deployed position.

In one embodiment, an adhesive can be applied to the junction of the latch 302 and the upper end of the deployment lever 308 to permanently prevent them from disengaging from one another as a result of, for example, shock or vibration.

Figure 6:
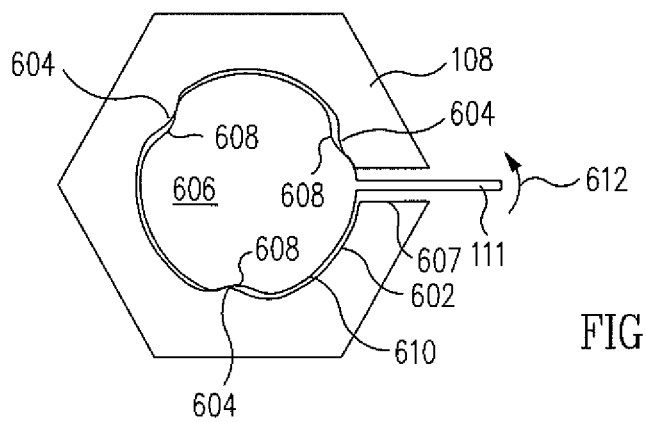
FIG. 6 is a partial plan view of a ball and socket mechanism of an actuator device useful in a method for deploying the device.

FIG. 6 illustrates another actuator device 100 deployment method and apparatus, which include forming a socket 602 in the outer frame 108 of the actuator device 100, the socket including a plurality of radial protrusions 604 on an inner surface thereof. A complementary ball 606 is formed concentrically within the socket 602. As those of skill in the art will appreciate, the terms "ball" and "socket" are used here in a figurative sense, as these features are generally more planar than spherical in configuration. The ball 606 is coupled to the motion control flexure 111 through a slot 607 in a side wall of the socket 602, and includes a plurality of indentations 608 that are respectively complementary in configuration to the radial protrusions 604 on the socket 602. The ball 606 and socket 602 can be used during deployment of the actuator device 100 to reduce the force required to move the moving frame 112 (not seen in FIG. 6) to the deployed position, and such that the moving frame 112 moves substantially rectilinearly and in a direction substantially perpendicular to the fixed frame 110.

In particular, in a pre-deployment configuration, the ball 606 and socket 602 define a generally uniform gap 610 between the two features. However, during deployment of the moving frame 112, a torque, indicated by the arrow 612, is applied to the motion control flexure 111 of the actuator 104 that is coupled to the moving frame 112, which could cause both the flexure 111 and the moving frame 112 to rotate undesirably. However, as illustrated in FIG. 6, when the ball 606 begins to rotate in the socket 602, the protrusions 604 of the socket 602 immediately engage the respective indentations 608 of the ball 606 and lock therein so as to prevent any further rotation of the motion control flexure 111 and the moving frame 112 to which the latter is coupled. As a result, the force required to move the moving frame 112 to the deployed position is reduced substantially, and during deployment, the moving frame 112 moves with substantially rectilinear motion and in a direction substantially perpendicular to the fixed frame 110.

Figure 7:
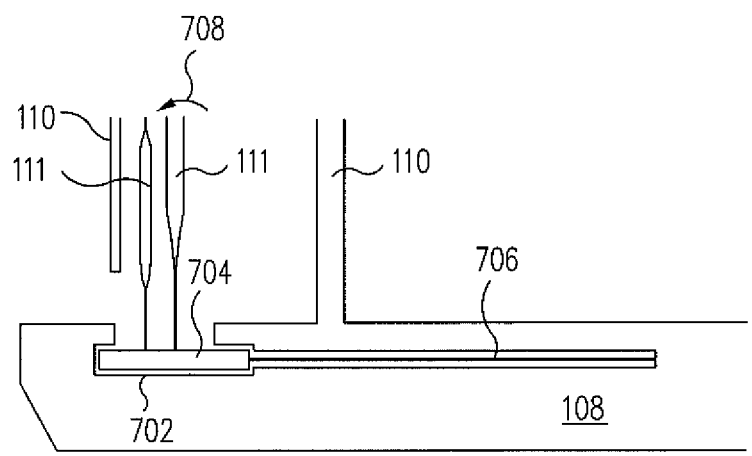
FIG. 7 is a partial plan view of another ball and socket mechanism of an actuator device useful in a method for deploying the device.

FIG. 7 illustrates another "ball-and-socket" method and apparatus useful in the deployment of the actuators 104 of an actuator device 100. In the embodiment of FIG. 7, a rectangular socket 702 is formed in the outer frame 108, and a complementary rectangular "ball" 704 is formed concentrically within the rectangular socket 702. The ball 704 is connected to the outer frame 108 by a ball spring 706 and to the moving frame 112 (not seen in FIG. 7) by the motion control flexure(s) 111. As in the embodiment discussed above in connection with FIG. 6, the ball 704 and socket 702 can be used when moving the moving frame 112 to the deployed position such that the moving frame 112 moves substantially rectilinearly and in a direction substantially perpendicular to the fixed frame 110.

In particular, during deployment of the moving frame 112, a torque, indicated by the arrow 708, could be applied to the motion control flexure 111, which is coupled to the moving frame 112, and cause both the flexure 111 and the moving frame 112 to rotate undesirably in the direction of the arrow. However, as illustrated in FIG. 7, when the rectangular ball 704 begins to rotate in the rectangular socket 702, the ball 704 is locked against further rotation by the corners of the socket 702, thereby preventing any further rotation of the motion control flexure 706 and the moving frame 112. As a result, the moving frame 112 will then move substantially rectilinearly and in a direction substantially perpendicular to the fixed frame 110.

Figure 8:
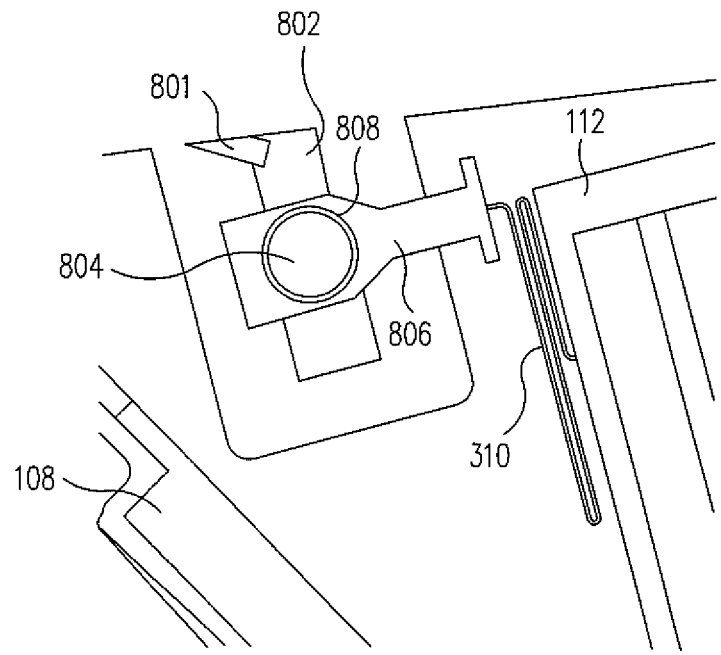
FIGS. 8 and 9 are partial plan views of an actuator device, showing another example method for deploying the device
Figure 9:
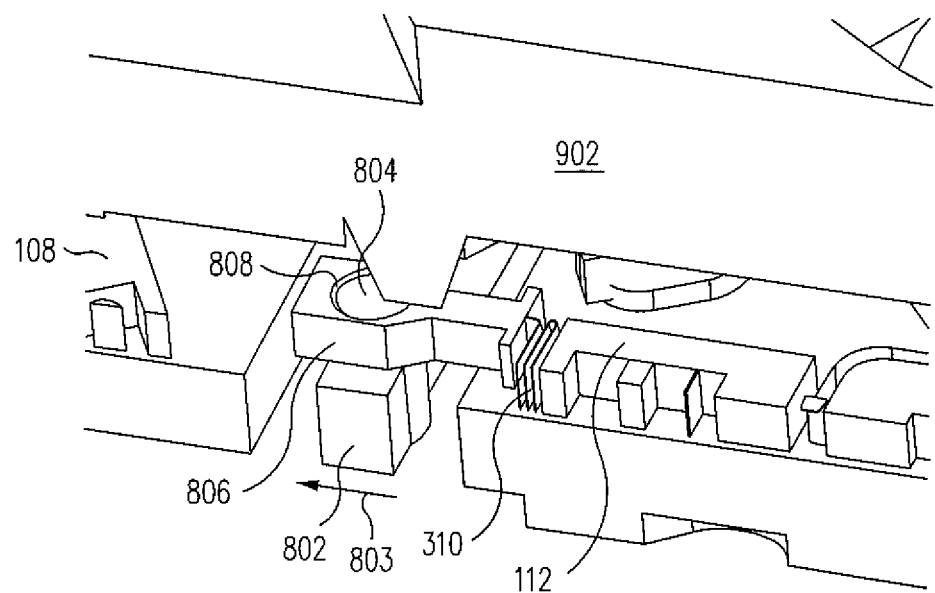

Another embodiment of a method and apparatus for deploying an actuator device 100 using "snubs" is illustrated in FIGS. 8 and 9. In FIG. 8, the method includes providing a lower snub 801 made of, e.g., a relatively soft plastic, and having a resilient cantilever 802 with an upstanding post 804 disposed thereon. A connection pad 806 coupled to the moving frame 112 by a deployment flexure 310 is also formed on the device 100. The connection pad 806 has an opening 808 extending therethrough that corresponds closely in size and configuration to the circumferential periphery of the post 804, and for deployment, the post 804 is disposed concentrically in the opening 808 of the connection pad 806.

As illustrated in FIG. 9, a downward force can then be applied to the post 804 and cantilever 802 using, e.g., an upper, moving, chamfered plastic snub 902, such that the connection pad 806 is urged in the direction of the arrow 803 and the pad 806 causes the deployment flexure 310 to pull the moving frame 112 to the deployed position. As in the latching embodiments discussed above in connection with FIGS. 3-5, the moving frame 112 can then be fixed in the deployed position with, e.g., an adhesive.

Figure 10:
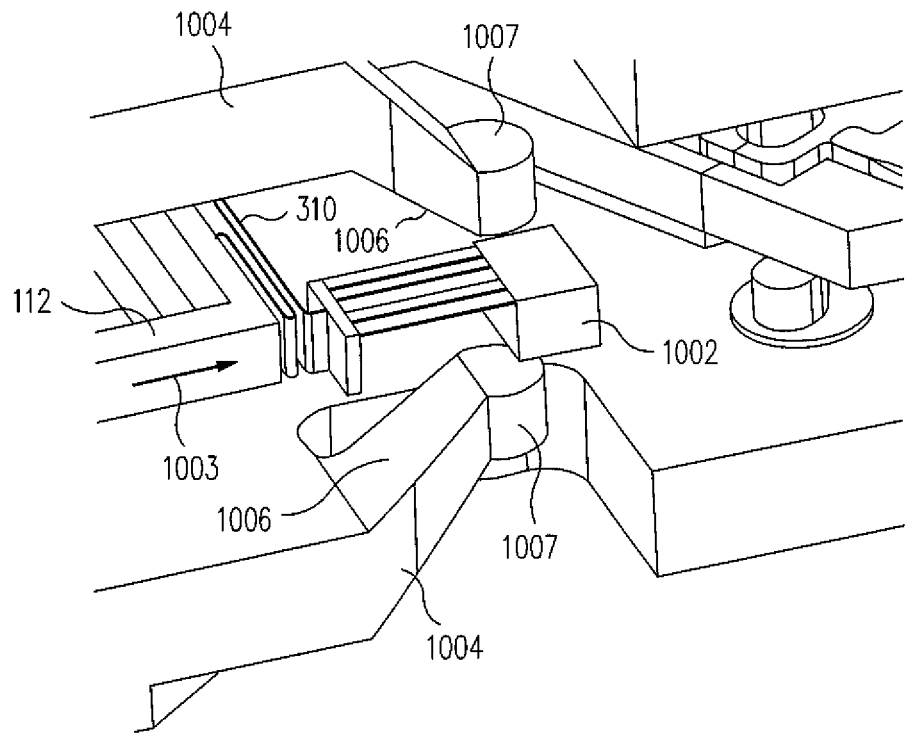
FIG. 10 is a partial plan view of an actuator device, showing another example method for deploying the device.

Another embodiment of a method and apparatus for deploying an actuator device 100 using snubs is illustrated in FIG. 10. The method of FIG. 10, as above, includes forming an engagement pad 1002 coupled to the moving frame 112 by a deployment flexure 310. The method further includes providing a pair of resilient snubs 1004, e.g., relatively soft, plastic snubs, disposed in spaced opposition to each other. Each snub 1004 has an inclined arm, or "motion converter" 1006 disposed bilaterally symmetrical with respect to the arm of the other snub, and an associated pusher pad 1007 disposed at the end of each arm. The resilient inclined arms 1006 are functional, when urged together vertically, to convert such vertical motion into conjoint lateral movement of the pusher pads 1007 at their ends.

In one embodiment, the engagement pad 1002 is disposed between the two pusher pads 1007 of the snubs 1004, and the snubs are then urged toward each other vertically such that the engagement pad 1002 is pressed forcefully between the pusher pads 1007. Continued urging of the snubs 1004 and pusher pads 1007 toward each other causes the inclined arms 1006 to bend away from each other, thereby causing the pusher pads 1007 to urge the engagement pad 1002 laterally and the deployment flexure 310 to pull the moving frame 112 in the direction of the arrow 1003, to the deployed position. In an alternative embodiment of this method, the engagement pad 1002 can be placed directly on the pusher pad 1007 of the lower one of the snubs 1004, and the upper one of the snubs 1004 can then be urged downward toward the lower snub to effect substantially the same result.

Figure 11:
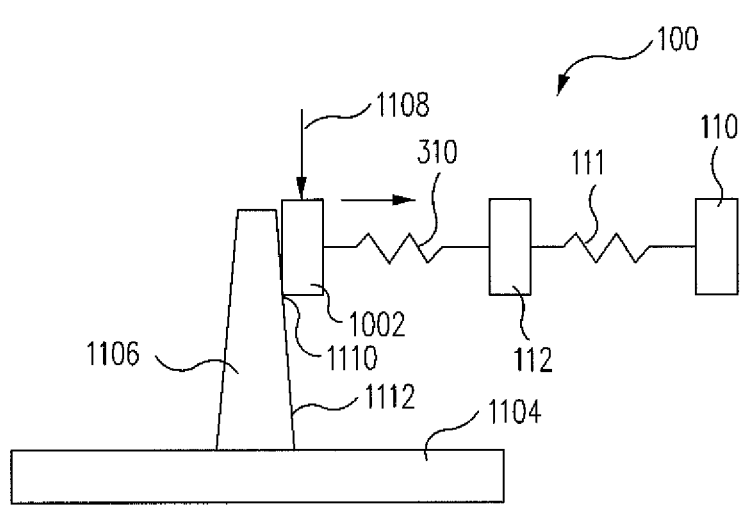
FIG. 11 is a schematic side elevation view of an actuator device, showing another example method for deploying the device.

Another embodiment of a method and apparatus for deploying an actuator device 100 is illustrated schematically in FIG. 11. In the embodiment of FIG. 11, the method includes forming a deployment pad 1102 coupled to the moving frame 112 by a deployment flexure 310. The moving frame 112 is in turn coupled to the fixed frame 110 and/or outer frame 108 by one or more motion control flexures 111. The method further includes providing a stationary fixture 1104. The fixture 1104 has a chamfered pillar 1106 upstanding therefrom. As illustrated in FIG. 11, the actuator device 100 can be urged downward toward the fixture 1104, as indicated by the arrow 1108, such that an edge 1110 of the deployment pad 1002 contacts a chamfered surface 1112 of the pillar 1106 and causes the deployment pad 1002 and deployment flexure 310 to move laterally and thereby urge the moving frame 112 to the deployed position. As those of some skill in the art will appreciate, a similar result can be obtained by holding the actuator device 100 stationary and urging the fixture 1104 upward relative to the device 100.

Figure 12:
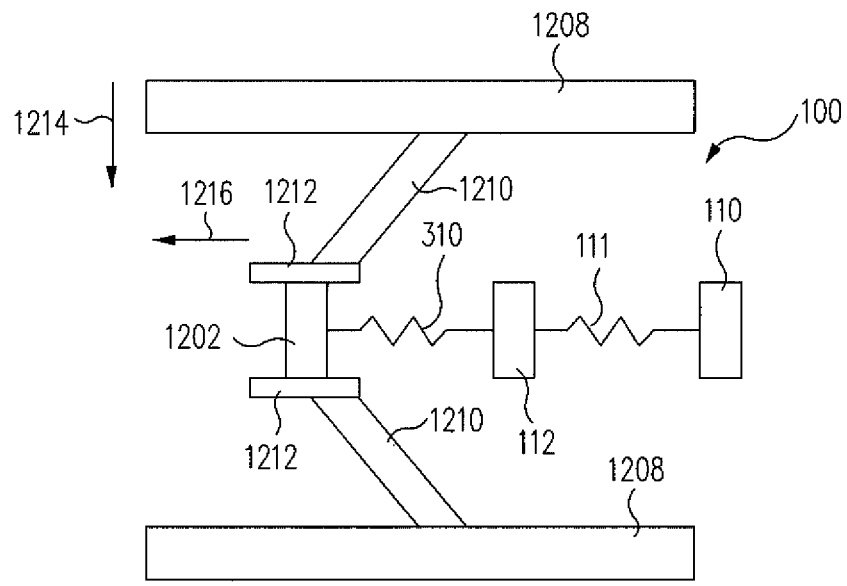
FIG. 12 is a schematic side elevation view of an actuator device, showing another example method for deploying the device.

Another embodiment of a method and apparatus for deploying an actuator device 100 using snubs is illustrated schematically in FIG. 12. As discussed above in connection with the embodiments of FIGS. 8-10, in the embodiment of FIG. 12, the method includes forming a deployment stage 1202 coupled to the moving frame 112 by a deployment flexure 310. The moving frame 112 can be, as above, coupled to the fixed frame 110 by a motion control flexure 111. The method further includes providing a pair of snubs 1208 made of, e.g., a relatively soft plastic, disposed in spaced opposition to each other. Each snub 1208 has a resilient inclined arm or "motion converter" 1210 disposed bilaterally symmetrical with respect to the motion converter of the other snub. Each of the motion converters 1210 has a pusher pad 1212 disposed at a distal end thereof. The lower surface of the deployment stage 1202 is placed against an upper surface of the pusher pad 1212 of a lower one of the motion converters 1210, and a lower surface of the pusher pad 1212 of an upper one of the motion converters 1210 is placed against the upper surface of the deployment stage 1202, such that the deployment stage is forcefully pressed between the two pusher pads 1212. The upper snub 1208 is then urged downward in the direction of the arrow 1214 and toward the lower snub 1208, causing the motion converters 1210 to bend away from each other, thereby causing the pusher pads 1212 to urge the deployment stage 1202 laterally in the direction of the arrow 1216 and the deployment flexure 310 to pull the moving frame 112 in the direction of the arrow 1216 to the deployed position.

Figure 13:
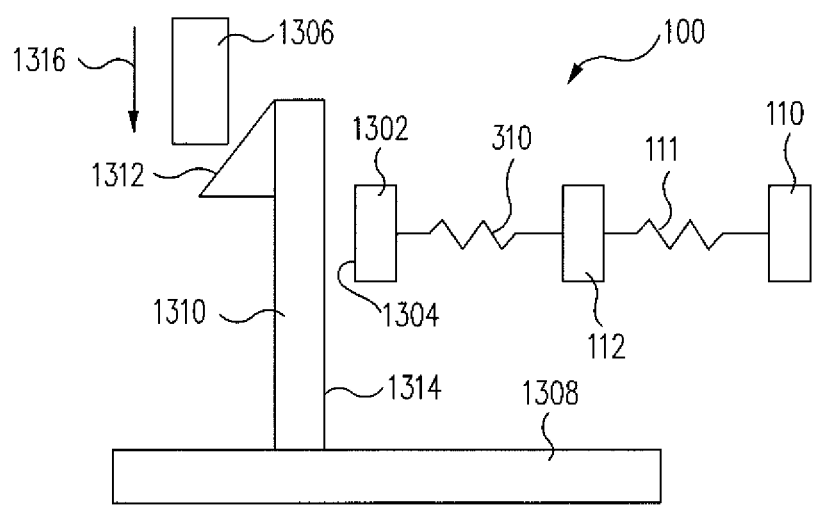
FIG. 13 is a schematic side elevation view of an actuator device, showing another example method for deploying the device.

Another embodiment of a method and apparatus for deploying an actuator device 100 using snubs is illustrated schematically in FIG. 13. In the embodiment of FIG. 13, the method includes forming a deployment stage 1302 coupled to the moving frame 112 by a deployment flexure 310, the deployment stage 302 having a lateral surface 1304. The moving frame 112, as above, could be coupled to the fixed frame 110 by a motion control flexure 111. The method further includes the provision of top and bottom snubs 1306 and 1308. The bottom snub 1308 has a pillar 1310 upstanding therefrom. The pillar 1310 has a chamfered surface 1312 disposed at an upper end and a lateral surface 1314. The actuator device 100 is placed on an upper surface of the bottom snub 1308 such that the lateral surface 1304 of the deployment stage 1302 is disposed in opposition with the lateral surface 1314 of the pillar 1310. The top snub 1306 is then urged downward, as indicated by the arrow 1316, and into contact with the chamfered surface 1312 of the pillar 1310, such that the bottom snub 1308 moves laterally, causing the lateral surface 1314 of the pillar 1310 to contact the opposing lateral surface 1304 of the deployment stage 1302 and urge the deployment stage 1202 laterally, thereby causing the deployment flexure 310 to urge the moving frame 112 to the deployed position.

Figure 14:
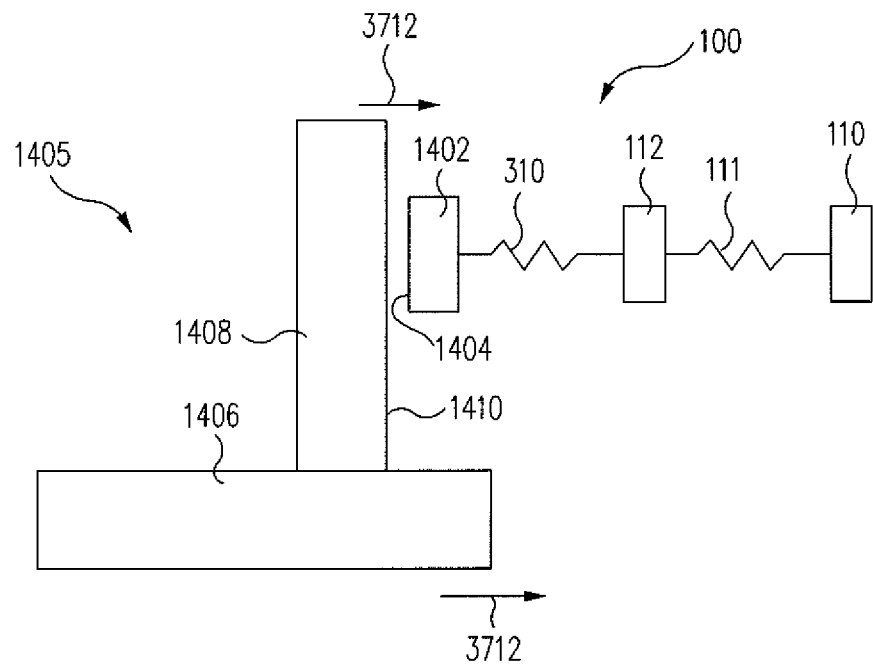
FIG. 14 is a schematic side elevation view of an actuator device, showing another example method for deploying the device.

Another embodiment of a method and apparatus for deploying an actuator device 100 using, e.g., another MEMS device 1405, is illustrated schematically in FIG. 14. In the embodiment of FIG. 14, the method includes forming a deployment pad 1402 coupled to the moving frame 112 by a deployment flexure 310, the pad 1402 having a lateral surface 1404. As above, the moving frame 112 can be coupled to the fixed frame 110 by, e.g., a motion control flexure 111. The method further includes providing a MEMS device 1405 having a laterally moving stage 1406 with an upstanding deployment peg 1408 disposed thereon. The deployment peg 1408 has a lateral surface 1410 disposed in opposition to the lateral surface 1404 of the deployment pad 1402. The MEMS device is actuated such that the stage 1406 and deployment peg 1408 move conjointly in the direction indicated by the arrows 3712, and cause the lateral surface 1410 of the deployment peg 1408 to contact the opposing lateral surface 1404 of the deployment pad 1402 and to urge the deployment pad 1402 laterally in the same direction, thereby causing the deployment flexure 310 to urge the moving frame 112 to the deployed position.

Figure 15:
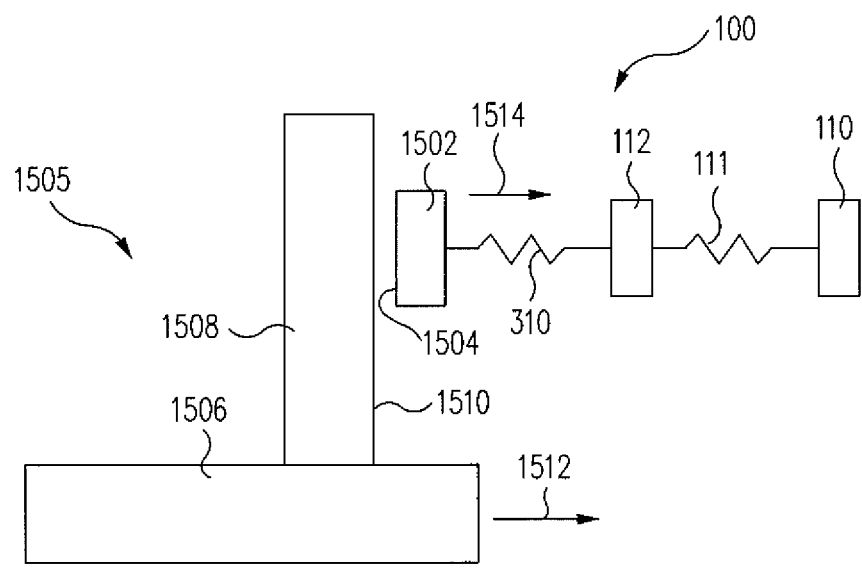
FIG. 15 is a schematic side elevation view of an actuator device, showing another example method for deploying the device.

Another embodiment of a method and apparatus for deploying an actuator device 100 using thermal expansion is illustrated schematically in FIG. 15. In the embodiment of FIG. 15, the method includes forming a deployment pad 1502 coupled to the moving frame 112 by a deployment flexure 310, the pad 1502 having a lateral surface 1504. The moving frame 112, as above, could be coupled to the fixed frame 110 by a motion control flexure 111. The method further includes providing a fixture 1506 made of a material having a positive coefficient of thermal expansion and an up-standing deployment peg 1508 disposed thereon. The deployment peg 1508 has a lateral surface 1510 disposed in opposition to the lateral surface 1504 of the deployment pad 1502. The fixture 1506 can then be heated such that the fixture 1506 and the deployment peg 1508 expand in the lateral direction indicated by the arrow 1512, causing the lateral surface 1510 of the deployment peg 1508 to contact the opposing lateral surface 1504 of the deployment pad 1502, and to urge the deployment pad 1502 laterally, indicated by the arrow 1514, thereby causing the deployment flexure 310 to urge the moving frame 112 to the deployed position.

Figure 16:
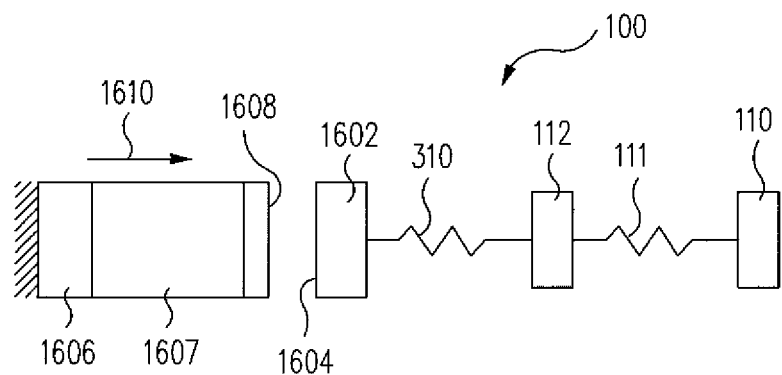
FIG. 16 is a schematic side elevation view of an actuator device, showing another example method for deploying the device.

Another embodiment of a method and apparatus for deploying an actuator device 100 using thermal expansion is illustrated schematically in FIG. 16. In the embodiment of FIG. 16, the method includes forming a deployment pad 1602 coupled to the moving frame by a deployment flexure 310, the pad 1602 having a lateral surface 1604. As in the embodiments above, the moving frame 112 can be coupled to the fixed frame 110 by a motion control flexure 111. The method further includes forming another fixed frame 1606 in the actuator device 100 that has a positive coefficient of thermal expansion or that includes a component 1607 having a positive coefficient of thermal expansion, and a lateral surface 1608 disposed in opposition to the lateral surface 1604 of the deployment pad 1602. The frame 1606 is heated, e.g., during a thermal cure of the component 1607, such that the frame 1606 and/or component 1607 expands laterally in the direction of the arrow 1610, causing the lateral surface 1608 of the frame 1606 to contact the opposing lateral surface 1604 of the deployment pad 1602 and to urge the deployment pad 1602 laterally, thereby causing the deployment flexure 310 to urge the moving frame 112 to the deployed position.

Figure 17:
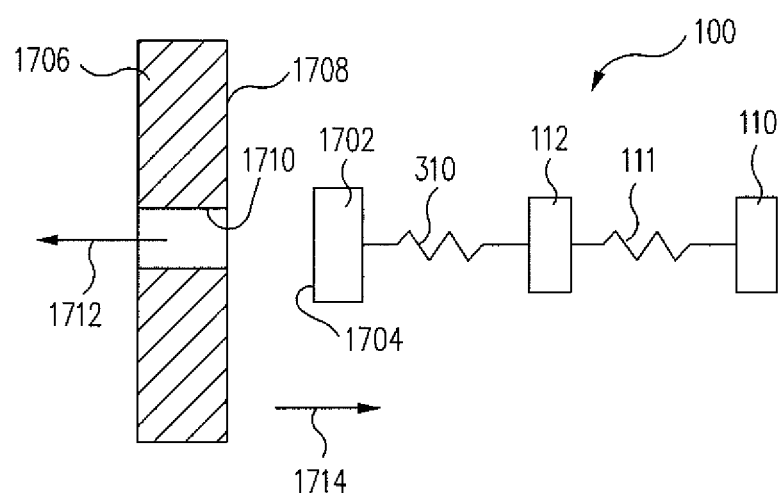
FIG. 17 is a schematic side elevation view of an actuator device, showing another example method for deploying the device.

Another embodiment of a method and apparatus for deploying an actuator device 100 using a vacuum is illustrated schematically in FIG. 17. In the embodiment of FIG. 17, the method includes forming a deployment pad 1702 coupled to the moving frame 112 by a deployment flexure 310, the pad 1702 having a lateral surface 1704. The method further includes providing a fixture 1706 having a lateral surface 1708 disposed in opposition to the lateral surface 1704 of the deployment pad 1702, and an orifice 1710 extending laterally therethrough. A vacuum, indicated by the arrow 1712, is applied to the orifice 1710 in the fixture 1706 such that the lateral surface 1704 of the deployment pad 1702 is pulled laterally toward the lateral surface 1708 of the fixture 1706 by the vacuum 1712, causing the deployment pad 1702 to move laterally in the direction of the arrow 1714, and the deployment flexure 310 to urge the moving frame 112 to the deployed position.

Figure 18:
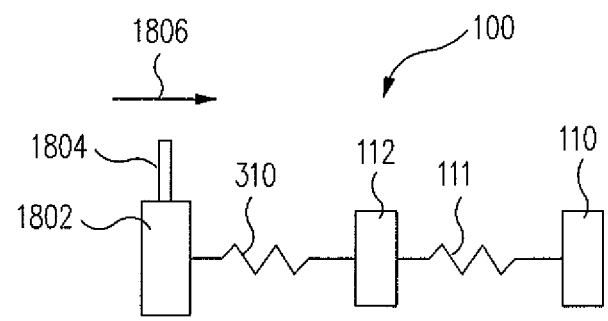
FIG. 18 is a schematic side elevation view of an actuator device, showing another example method for deploying the device.

Another embodiment of a method and apparatus for deploying an actuator device 100 using a magnetic field is illustrated schematically in FIG. 18. In the embodiment of FIG. 18, the method includes forming a deployment pad 1802 coupled to the moving frame 112 by a deployment flexure 310, the pad 1802 having a permanent magnet 1804 disposed thereon. The method further includes moving a magnetic field, indicated by the arrow 1806, over the magnet 1804 on the deployment pad 1802, such that the deployment pad 1802 moves laterally in the direction of the arrow 1806, thereby causing the deployment flexure 310 to urge the moving frame 112 to the deployed position.

Figure 19:
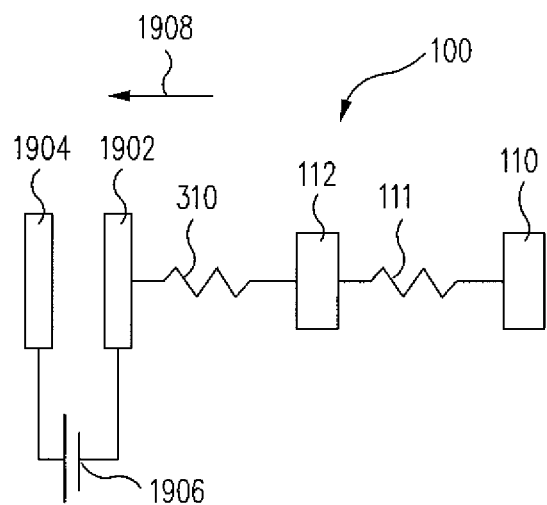
FIG. 19 is a schematic side elevation view of an actuator device, showing another example method for deploying the device.

Another embodiment of a method and apparatus for deploying an actuator device 100 using electrostatic forces is illustrated schematically in FIG. 19. In the embodiment of FIG. 19, the method includes forming a deployment stage 1902 coupled to the moving frame 112 by a deployment flexure 310. The method further includes providing a stationary stage 1904 disposed adjacent to and spaced apart from the deployment stage 1904. A voltage differential 1906 is applied to the deployment and stationary stages 1902 and 1904 such that the deployment stage 1902 moves laterally in the direction of the arrow 1908 toward the stationary stage 1904 and causes the deployment flexure 310 to urge the moving frame 112 to the deployed position.

In addition to the several methods and apparatus described above for deploying the actuator device 100 using mechanical, thermal expansion, vacuum, magnetic and electrostatic forces, additional methods exist for doing so using capillary forces.

Figure 20A:
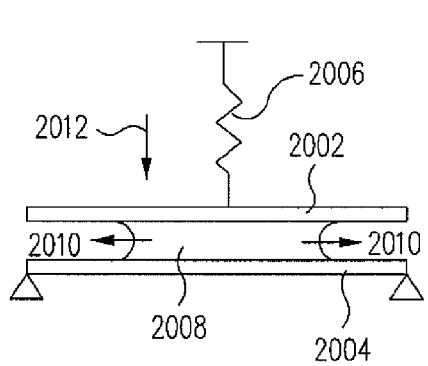
FIGS. 20A and 20B respectively illustrate example methods for deploying an actuator device.
Figure 20B:
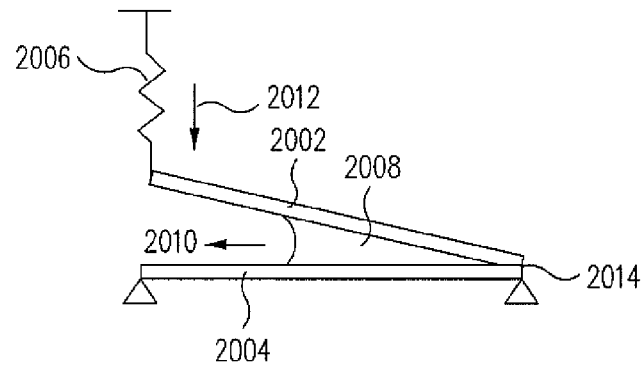

FIGS. 20A and 20B schematically illustrate how capillary forces exhibited by a liquid adhesive can be used to effect or assist deployment of the actuator device 100 and to fix the moving frames 112 in the deployed position. In FIG. 20A, a hydrophilic moving plate 2002 is disposed over a hydrophilic stationary plate 2004 by a spring 2006, which may comprise, e.g., a deployment flexure 310 or a motion control flexure 111. If a liquid, such as water or a liquid adhesive 2008 having suitable molecular properties, is disposed between the two plates 2002 and 2004, it will wet the opposing surfaces of the two plates to form a meniscus, indicated by the arrows 2010, and the combination of the surface tension caused by molecular cohesion within the liquid adhesive 2008 and the forces of adhesion between the liquid adhesive 2008 and the plates will act to pull the moving plate 2002 in translation toward the stationary plate 2004 and against the bias of the spring 2006, in the direction of the arrow 2012. Curing of the adhesive 2008 thereafter can effectively fix the final relative positions of the two plates 2002 and 2004.

A similar arrangement is illustrated in FIG. 20B, except that the moving plate 2002 is coupled for rotational movement relative to the stationary plate 2004 by a hinge 2014 disposed at an edge thereof. Hence, in the embodiment of FIG. 20B, the cohesive and adhesive forces act to pull the moving plate 2002 rotationally about the hinge 2014 and toward the stationary plate 2004 in the direction of the arrow 2012.

As those of some skill in this art will appreciate, the same capillary forces acting in the translational and rotational embodiments of FIGS. 20A and 20B above can be harnessed to deploy an actuator device 100 prior to its use.

Figure 21:
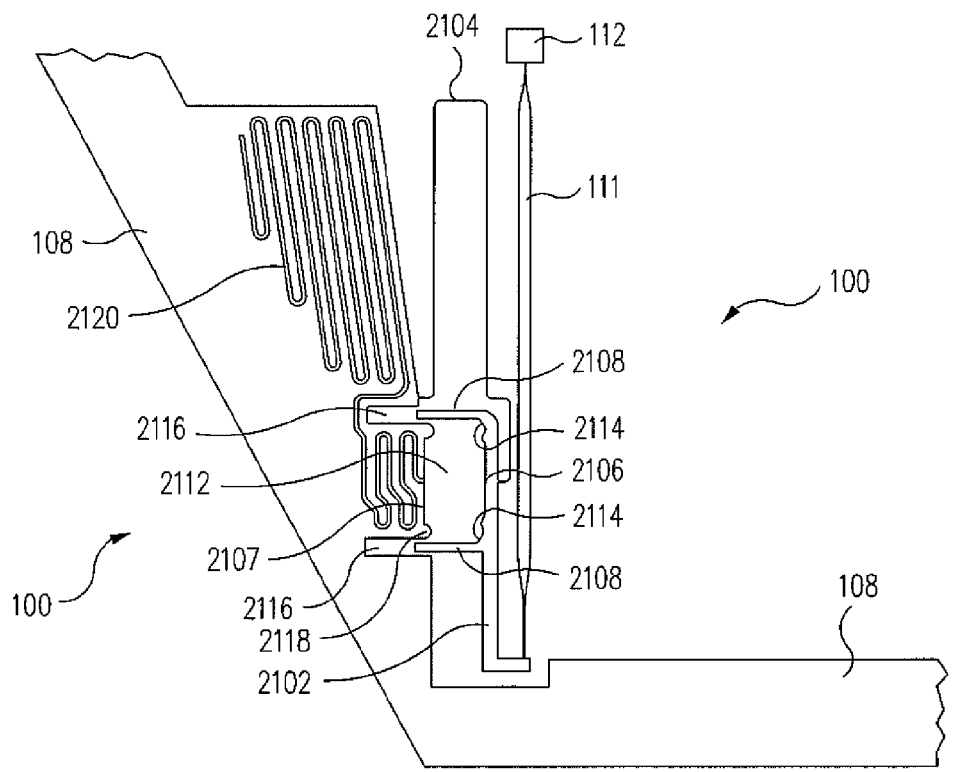
FIG. 21 is a partial plan view of an actuator device, showing another example method for deploying the device.

An example embodiment of a method and apparatus for deploying an actuator device 100 using capillary forces is illustrated in the partial top plan view of FIG. 21. In the embodiment of FIG. 21, the method includes forming a moving plate 2102 having an upper portion coupled to the outer frame 108 by an attachment spring 2104, a lower end coupled to the motion control flexure 111 (which is coupled at its upper end to the moving frame 112), a side wall 2106 disposed adjacent to and spaced apart from a side wall 2107 of the outer frame 108, a pair of arms 2108 extending toward and defining a gap 2112 between the opposing side walls 2106 and 2107 of the moving plate 2102 and the outer frame 108, and a pair of registration locks 2114 disposed in the gap 2112.

The method further comprises forming a pair of parallel slots 2116 and a pair of parallel registration keys 2118 in the adjacent side wall 2207 of the outer frame 108. Each slot 2116 is configured to receive a respective one of the arms 2108 of the moving plate 2102 in a complementary engagement, and each registration key 2118 is configured to engage in a respective one of the registration locks 2114 thereof in complementary engagement. The method further includes forming a serpentine reservoir 2120 for receiving a liquid adhesive in the outer frame 108 and disposed in communication with the gap 2212 between the adjacent side walls 2106 and 2107 of the moving plate 2102 and the outer frame 108.

To effect deployment, a suitable liquid adhesive is disposed in the gap 2112 such that the adhesive is wicked into the serpentine reservoir 2120 in the outer plate 108, which creates a capillary force between the adjacent side walls 2106 and 2107 of the moving plate 2102 and the outer frame 108 that acts to draw the adjacent side wall 2106 of the moving plate 2102 laterally toward the adjacent side wall 2107 of the outer frame 108, thereby causing the respective arms 2108, slots 2116, registration locks 2114 and registration keys 2118 of the moving plate 2102 and the outer frame 108 to move into engagement with each other, thereby causing the motion control flexure 111 to urge the moving frame 112 to the deployed position.

During deployment, the reservoir 2120 serves to store surplus adhesive while the moving plate 2102 moves, and the engagement of the complementary registration features 2108, 2116, 2114 and 2118 serve to confine movement of the moving plate 2102 to substantially lateral translational movement.

In some embodiments, the liquid adhesive can be cured or allowed to auto-cure to fix the moving frame 112 and the associated moving teeth 11413 (not seen in FIG. 21) in the deployed position, i.e., for substantially coplanar, rectilinear movement perpendicularly to the fixed frame 110 and associated fixed teeth 114B thereof.

Figure 22:
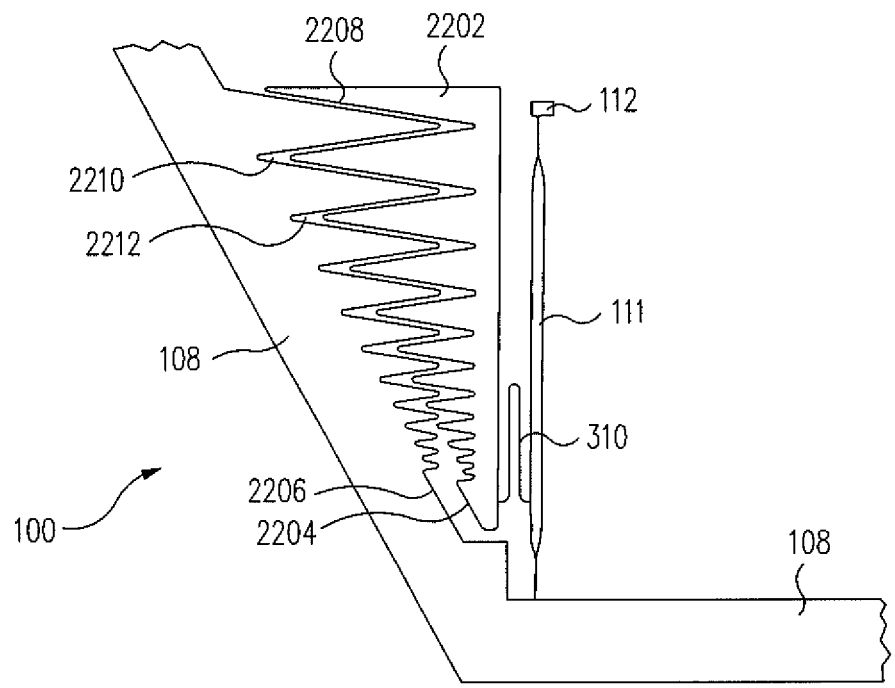
FIG. 22 is a partial plan view of an actuator device, showing another example method for deploying the device.

Another example embodiment of a method and apparatus for deploying an actuator device 100 using capillary forces is illustrated in the partial top plan view of FIG. 22. In the embodiment of FIG. 22, the method includes forming a moving plate 2202 coupled to the motion control flexure 111 by a deployment flexure 310 and having a side wall 2204 disposed adjacent to a side wall 2206 of the outer frame 108. The inner end of the motion control flexure 111 can, as above, be coupled to the moving frame 112. The adjacent side walls 2204 and 2206 of the moving plate 2202 and the outer frame 108 are formed to respectively contain complementary zigzag patterns 2208 and 2210 that define a zigzag gap 2212 between the adjacent side walls 2204 and 2206 of the moving plate 2202 and the outer frame 108.

To effect deployment in this embodiment, a liquid adhesive can be disposed in the zigzag gap 2212 such that the liquid adhesive creates a capillary force between the adjacent side walls 2204 and 2206 of the moving plate 2202 and the outer frame 108, which draws the moving plate 2202 and the deployment flexure 310 laterally toward the outer plate 108, thereby causing the motion control flexure 111 to urge the moving frame 112 to the laterally deployed position. In this embodiment, the length, shape and width of the zigzag gap 2212 are configured to increase the distance that the moving plate 2202 moves laterally during deployment, while at the same time maintaining an adequate deployment force, and to obviate the need for a reservoir for the storage of surplus adhesive, as in the embodiment of FIG. 21 described above.

As discussed above, in some embodiments, the liquid adhesive can be actively cured or allowed to auto-cure so as to fix the moving frame 112 and the associated moving teeth 114B (not seen in FIG. 22) in the deployed position.

Figure 23:
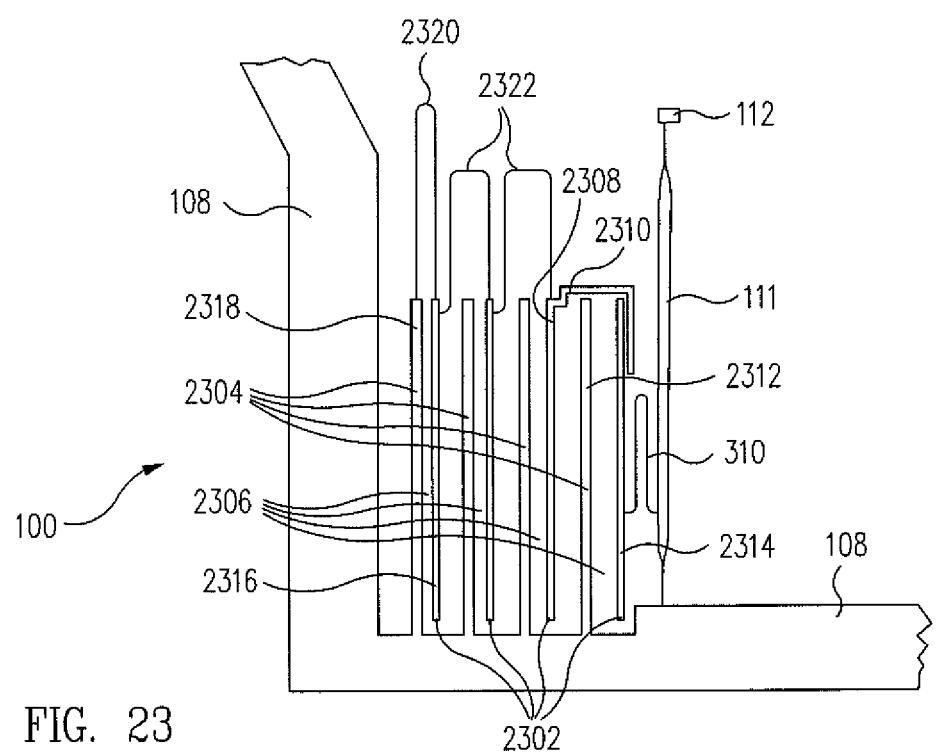
FIG. 23 is a partial plan view of an actuator device, showing another example method for deploying the device.

Another example embodiment of a method and apparatus for deploying an actuator device 100 using capillary forces is illustrated in the partial top plan view of FIG. 23. In the embodiment of FIG. 23, the method includes forming a plurality of moving plates 2302 respectively interleaved between a corresponding plurality of stationary plates 2304 attached to the outer frame 108 and defining a corresponding plurality of gaps 2306 between respective outer side walls of the moving plates 2302 and respective inner sidewalls of the stationary plates 2304. The next to last, or penultimately innermost one 2308 of the moving plates 2302 is formed to include an L-shaped arm 2310 that overarches an innermost one 2312 of the stationary plates 2304 and extends downwardly and adjacent to an upper end of an inner side wall of an innermost one 2314 of the moving plates 2302.

As illustrated in FIG. 23, an outermost one 2316 of the moving plates 2302 is coupled to an outermost one 2318 of the stationary plates 2304 with an attachment spring 2320. Adjacent ones of the moving plates 2302 intermediate of the outermost and innermost ones 2318 and 2312 of the stationary plates 2304 are respectively coupled to each other with a plurality of attachment springs 2322. The innermost one 2314 of the moving plates 2302 is coupled to the motion control flexure 111 with a deployment flexure 310.

To effect deployment in this embodiment, a liquid adhesive is disposed in the gaps 2306 between the plates 2302 and 2304 such that the liquid adhesive creates a capillary force between the adjacent side walls of the moving plates 2302 and the stationary plates 2304 that draws the moving plates 2302 and the deployment flexure 310 laterally toward the fixed frame 108, thereby causing the motion control flexure 111 to urge the moving frame 112 to the laterally deployed position.

In one embodiment, the liquid adhesive can be disposed in the gaps 2306 sequentially, beginning with an outermost one of the gaps 2306 and proceeding inwardly. This enables each succeeding gap 2306 to be made progressively smaller so that the selected deployment distance is made larger while the force required for deployment is maintained relatively constant.

As above, in some embodiments, the liquid adhesive can be actively cured or allowed to auto-cure to fix the moving frame 112 and the associated moving teeth 114B (not seen in FIG. 23) in the deployed position.

Figure 24:
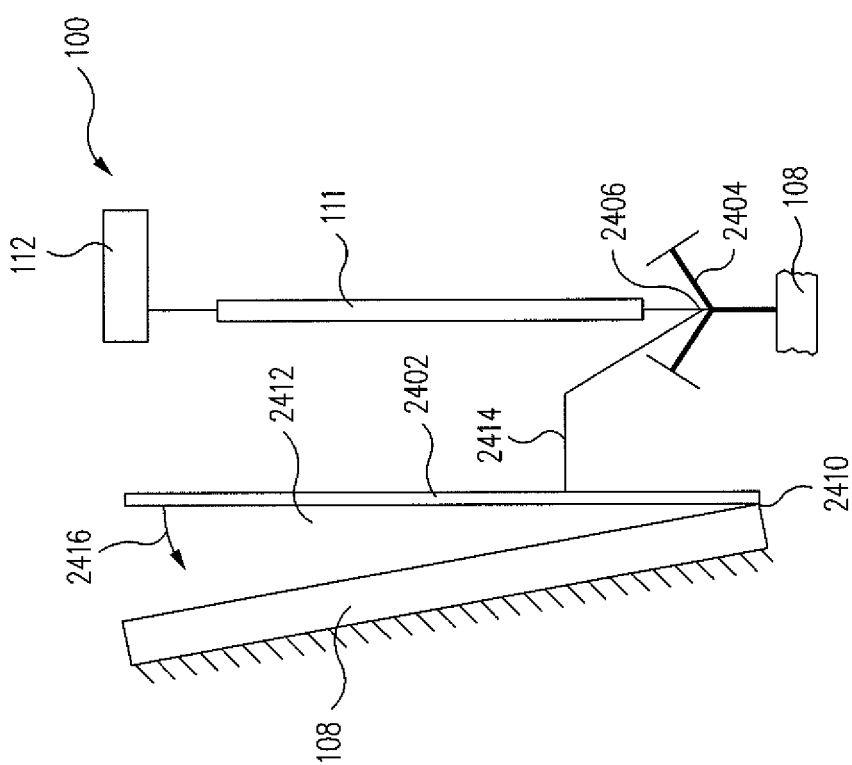
FIG. 24 is a schematic side elevation view of an actuator device, showing another example method for deploying the device.

Another example embodiment of a method and apparatus for deploying an actuator device 100 using capillary forces is illustrated schematically in FIG. 24. In the embodiment of FIG. 24, the outer end of the motion control flexure 111 is coupled to the outer frame 108 by a plurality of attachment springs 2404 coupled to each other and to the motion control flexure 111 at a nexus 2406. An inner end of the motion control flexure 111 is coupled to the moving frame 112.

In the embodiment of FIG. 24, the method includes forming a moving plate 2402 rotatably attached to a stationary plate, e.g., the outer frame 108, by a hinge 2410 at a lower end thereof and defining an angular gap 2412 between adjacent sidewalls of the moving plate 2402 and the stationary plate 108. The method further includes forming a connection beam 2414 coupling the moving plate 2402 to the nexus 2406 of the attachment springs 2404.

To effect deployment, a liquid adhesive is disposed in the angular gap 2412 such that the liquid adhesive creates a capillary force between the adjacent side walls of the moving plate 2402 and the stationary plate 108 that rotates the moving plate 2402 and connection beam 2414 laterally about the hinge 2410 and toward the stationary plate 108, as indicated by the arrow 2416, thereby causing the motion control flexure 111 to urge the moving frame 112 laterally to the deployed position.

As above, in some embodiments, the liquid adhesive may be cured or allowed to auto-cure to lock the moving frame 112 and the associated moving teeth 114B (not seen in FIG. 24) in the deployed position.

Figure 25:
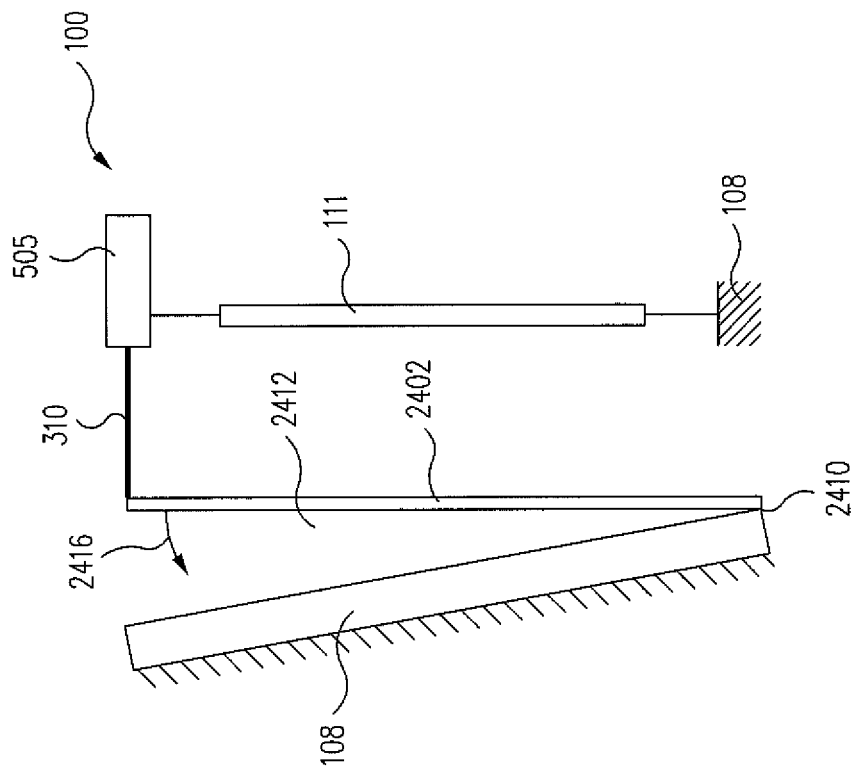
FIG. 25 is a schematic side elevation view of an actuator device, showing another example method for deploying the device.

Another example embodiment of a method and apparatus for deploying an actuator device 100 using capillary forces is illustrated schematically in FIG. 25. As may be seen in a comparison of FIGS. 24 and 25, the latter embodiment is substantially similar to the former, with the following differences: The outer end of the motion control flexure 111 is coupled directly to the stationary or outer frame 108, the connection beam 2414 and attachment springs 2404 are eliminated, and the moving plate 2402 is instead coupled directly to the moving frame 112 by a deployment flexure 310.

In the embodiment of FIG. 25, as in that of FIG. 24, deployment is effected by disposing a liquid adhesive in the angular gap 2412 such that the liquid adhesive creates a capillary force between the adjacent side walls of the moving plate 2402 and the stationary plate 108 that rotates the moving plate 2402 and deployment flexure 310 laterally, in the direction of the arrow 2416, about the hinge 2410 and toward the stationary plate 108, thereby causing the moving frame 2402 to move laterally to the deployed position.

As above, in some embodiments, the liquid adhesive may be cured or allowed to auto-cure to lock the moving frame 112 and the associated moving teeth 114B (not seen in FIG. 25) in the deployed position.

Figure 26:
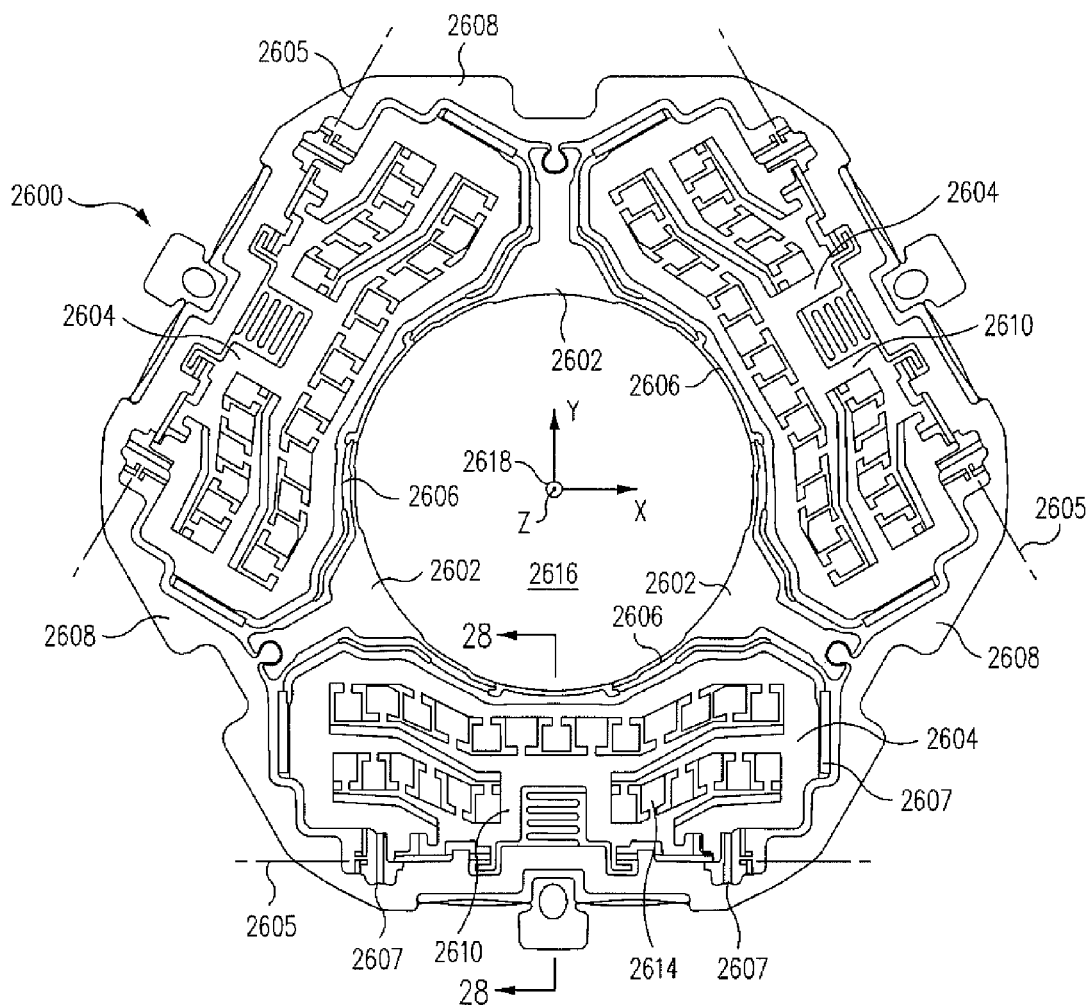
FIG. 26 is a front end plan view of an example embodiment of an actuator device in accordance with the present disclosure.

An example actuator device 2600 useful for effecting, e.g., movement of a lens or lens group along an optical or Z axis of a camera or telephoto lens is illustrated in FIGS. 26 and 27 and described in detail in commonly owned U.S. patent application Ser. No. 12/946,515, filed Nov. 15, 2010, which is incorporated herein by reference. A miniature lens barrel for a camera incorporating such an actuator device 2600 is described in detail in commonly owned U.S. patent application Ser. No. 12/946,680, also filed Nov. 15, 2010 and incorporated herein by reference.

As illustrated in FIGS. 26 and 27 and discussed in the foregoing disclosures, the generally planar actuator device 2600 comprises a moveable stage 2602 resiliently supported for movement in the ±Z direction, i.e., into and out of the plane of the device 2600, two or more actuators 2604, each coupled to an outer periphery of the stage 2602 by one or more solid, resilient hinges, or "flexures" 2606, and operable to apply a respective rotational force in the ±Z direction to the stage 2602 when actuated, and an outer frame 2608 surrounding and supporting the stage 2602 and the actuators 2604 during operation. In the particular actuator device 2600 illustrated, three actuators 2604 are provided, but in other possible embodiments, either a fewer or a greater number of actuators 2604 can be employed.

As illustrated in the figures, in some embodiments, the actuator device 2600 can comprise a micro electromechanical systems (MEMS) device 2600 that can be fabricated as a single integral structure from a substrate of, for example, silicon, using well-known micromachining and/or photolithography techniques, and as illustrated in FIGS. 26 and 27, the actuators 2604 can comprise, for example, electrostatic "comb drive" actuators, each comprising a fixed frame 2610, a moving frame 2612 resiliently supported for rotational movement relative to the fixed frame 2610 and the outer frame 2608, and a plurality of interdigitated teeth 2614 alternately attached to the fixed and the moving frames 2610 and 2612.

Additionally, as illustrated in FIGS. 26-27, in some embodiments, the stage 2602 can incorporate a central opening 2616 having a center or centroid 2618, and within which, for example, a lens, a group of lenses (a lens group) or other types of optical elements can be concentrically mounted for conjoint movement with the stage 2602 in the ±Z direction. Alternatively, the central opening 2616 in the stage 2602 can be omitted, such that the stage 2602 defines a moveable platform upon which, for example, an integrated circuit (IC) comprising an imaging sensor of a known type can be mounted.

Figure 28A:
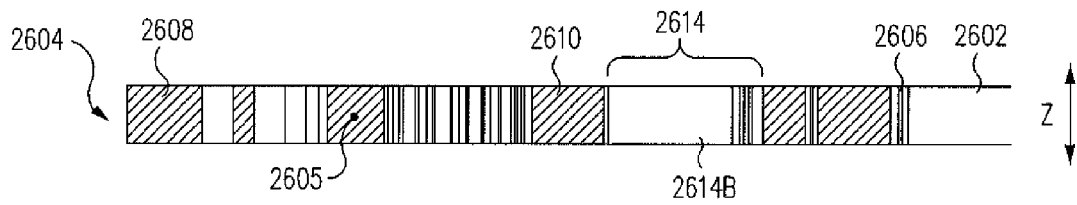
FIGS. 28A-28C are partial cross-sectional views of the actuator device of FIG. 26 as seen along the lines of the section 28-28 taken therein, respectively showing the device in an as-fabricated state, a deployed state, and a deployed and actuated state.
Figure 28B:
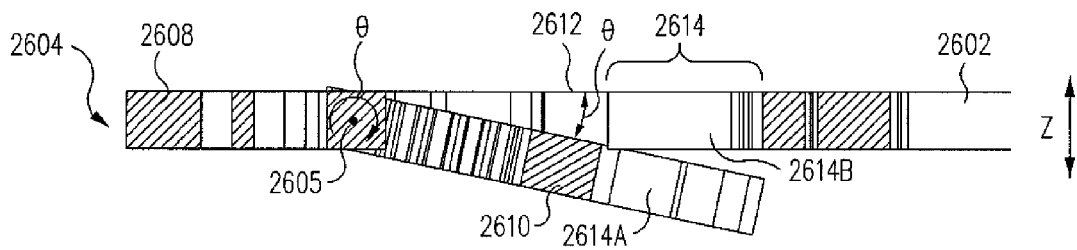
Figure 28C:
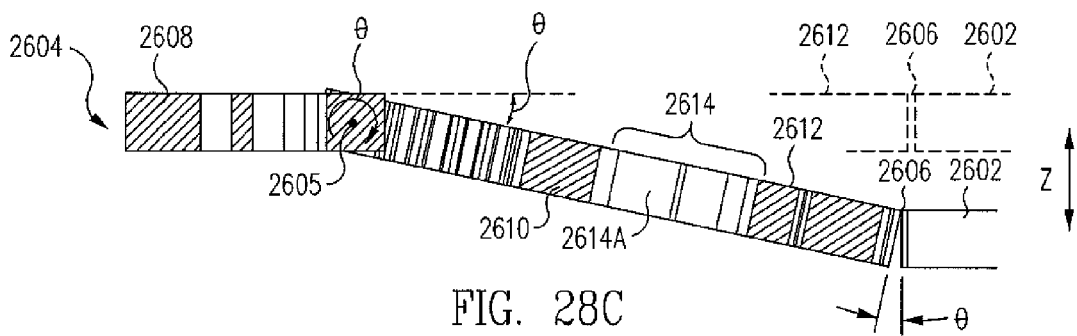

As discussed in more detail in the above commonly owned applications, in some electrostatically actuated embodiments, the actuator device 2600 can be fabricated as a generally planar structure in which the interdigitated teeth 2614 of the actuators 2604 are disposed co-planar with each other, i.e., all lie in the plane of the device. As those of skill in the art will appreciate, in this orientation, the application of a voltage differential to the interdigitated teeth 2614 of the comb drive actuators 2604 cannot result in any desired out-of-plane movement of the stage 2602 in the Z direction. Accordingly, as illustrated in FIGS. 28A-28C, prior to operation of such actuator devices 2600, the fixed frame 2610 of each actuator 2604 is "deployed" to offset the adjacent pairs of teeth 2614 respectively attached to the fixed and moving frames 2610 and 2612 at an angle θ with respect to one another. Such deployment results in a non-planar overall configuration of the actuator device 2600. Methods and apparatus for rotationally deploying such an actuator device 2600 for subsequent ±Z actuation and for fixing them in the deployed state are described in detail in commonly owned U.S. patent application Ser. No. 12/946,646, filed Nov. 15, 2010 and incorporated herein by reference.

As described therein, when thus deployed, each actuator 2604 then includes a portion, viz., the fixed frame 2610, that extends below the plane of the outer frame 2608, as illustrated in FIGS. 27 and 28A-28C. Once deployed thus, the fixed frames 2610 can then be respectively fixed or locked into position such that they do not move further with respect to the outer frame 2608, and are angularly offset or "rotated" at an angle θ with respect to the associated moving frames 2612. Actuation of the actuator 2604, e.g., by application or removal of a voltage differential across the respective teeth 2614 of the fixed and moving frames 2610 and 2612, will then cause the movable frames 2612 to rotate down and toward or up and away from the deployed fixed frames 2610 to effect a desired rectilinear movement of the stage 2602, and hence, any optical element mounted thereon, in the ±Z direction.

Thus, as illustrated in FIGS. 26-28, in the particular example actuator device 2600 illustrated, both the fixed and moving frames 2610 and 2612 are hinged by a plurality of flexures 2607 to rotate downward about a common hinge line 2605 relative to each other and the outer frame 2608. Of course, as discussed in more detail below, other rotational hinging arrangements, not necessarily co-linear, are also possible. As illustrated in FIG. 28A, in the un-deployed state, the outer frame 2608, the fixed and moving frames 2610 and 2612 (together with the interdigitated teeth 2614A and 2614B respectively affixed thereto), and the stage 2602 hinged to the moving frame by the flexures 2606, are all disposed coplanar with each other in the plane of the device 2600.

As illustrated in FIG. 28B, when the actuator device 2600 is deployed for operational use, the moving frame 2610 of each actuator 2604, together with its associated portion of comb drive teeth 2614, is rotated downward about the hinge line 2605 through the deployment angle θ and fixed at that position, leaving the fixed frame 2612, associated teeth 2614B and the stage 2602 remaining disposed coplanar with the outer frame 2608.

As illustrated in FIG. 28C, if different voltages are then respectively applied to the teeth 2614A and 2614B of the fixed and moving frames 2610 and 2612 of an actuator 2604, the moving frame 2612 will be attracted to and rotate downward toward the fixed frame 2612, resulting in a corresponding downward rotational displacement of the stage 2602. However, since the stage 2602 is coupled to the moving frame 2612 by flexures 2606, and because the stage 2602 is similarly coupled to one or more other actuators 2604 disposed on the opposite side of the stage 2602, the stage 2602 will, rather than rotating, move with pure rectilinear movement in the −Z direction. Similarly, a removal of the voltage differential will result in a rectilinear movement of the stage 2602 in the opposite, i.e., in the +Z direction, i.e., back toward its original position.

In the particular example embodiment illustrated in FIGS. 26-28, the fixed frame 2610 and its associated teeth 2614A are shown rotated downward relative to the moving frame 2612 and its associated teeth 2614B to effect deployment of the actuator device 2600 for operation. However, as will be recognized by those of some skill in this art, a similar result can be obtained by rotating the moving frame 2612, its associated teeth 2614B, and the stage 2602 upward relative to the fixed frame 2610 and its associated teeth 2614A, while leaving the latter features disposed generally coplanar with the outer frame 2608. Such a deployment, as above, will likewise result in a non-planar overall configuration of the actuator device 2600, except that it is the stage 2602, moving frame 2612 and associated fixed teeth 2614B that are then displaced upwardly and out of the plane of the outer frame 2608, moving frame 2610 and associated moving teeth 2614B.

In such an embodiment, if different voltages are then respectively applied to the teeth 2614A and 2614B of the fixed and moving frames 2610 and 2612 of an actuator 2604, the moving frame 2612 and its associated teeth 2614B will, as before, be attracted to and rotate downward toward the fixed frame 2610 and its associated teeth 2614A, resulting in a corresponding downward rotational displacement of the stage 2602. As above, since the stage 2602 is coupled to the moving frame 2612 by flexures 2606, and because the stage 2602 is similarly coupled to one or more actuators 2604 disposed on the opposite side of the stage 2602, the stage 2602 will move, as above, with pure rectilinear movement in the −Z direction, and as above, a removal of the voltage will result in a rectilinear movement of the stage 2602 in the opposite, i.e., in the +Z direction, back toward its original position.

Figure 29A:
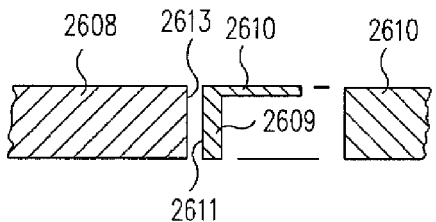
FIGS. 29A and 29B are partial cross-sectional views of a deployment foot of the example actuator device of FIG. 1, respectively showing the deployment foot before deployment of the device and adhesively fixed in place after deployment thereof.
Figure 29B:
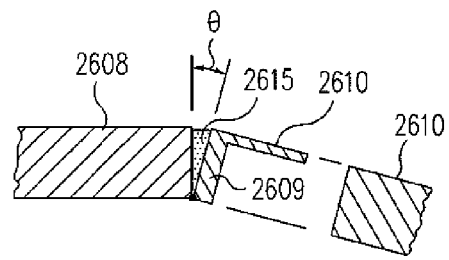

As those of some skill in this art will appreciate, in either case, when the fixed or moving frames 2610 or 2612 of the actuators 2604 have been rotated to their respective deployed positions, it is desirable to fix them at that position relative to the outer frame 2608. As discussed in commonly owned U.S. patent application Ser. No. 12/946,646 above, this fixing can be effected in a number of different ways. For example, as illustrated in FIG. 29A, the fixed frame 2610, for example, can be provided with a deployment foot 2609 having a side wall 2611 disposed in spaced opposition to a side wall 2613 of the outer frame 2608. As illustrated in FIG. 29B, after the fixed frame 2610 has been rotated down through the deployment angle θ, a fillet 2615 of, e.g., an adhesive, can be disposed in the angular space between the deployment foot 2609 and the outer frame 2608 to permanently fix the fixed frame 2610 in the deployed position.

While the foregoing and other methods described in U.S. patent application Ser. No. 12/946,646 provide satisfactory measures for deploying and fixing the fixed or moving frames 2610 or 2612 of an actuator 2604 in the deployed position, there may be cases in which it is desirable to deploy and fix the fixed or moving frames 2610 by means of a more positive "latching" arrangement. In accordance with the present disclosure, apparatus and methods are provided for deploying and latching the fixed or moving frames 2610 or 2612 of the actuators 2604 of an actuator device 2600 in the deployed position using such latching mechanisms.

Figure 30A:
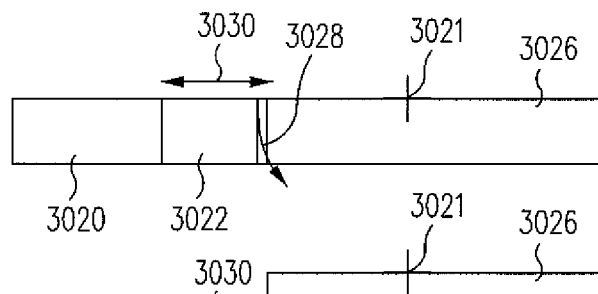
Figure 30C:
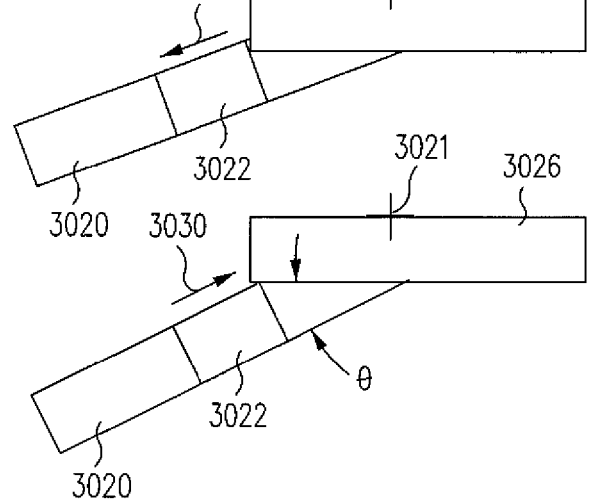
Figure 32A:
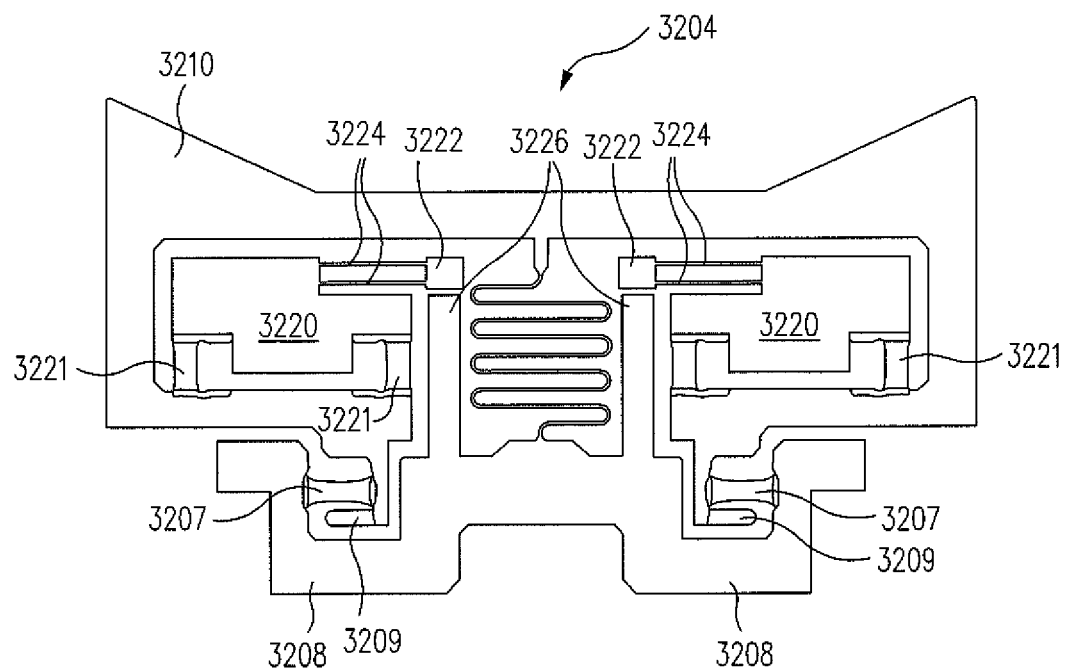
FIGS. 32A and 32B are, respectively, a partial top plan view of an actuator having an example rotational deployment latching mechanism in accordance with that of FIGS. 30A-30C, showing the actuator prior to deployment, and a partial upper left side perspective view of the actuator and latching mechanism of FIG. 32A, showing the actuator after deployment and latching.
Figure 32B:
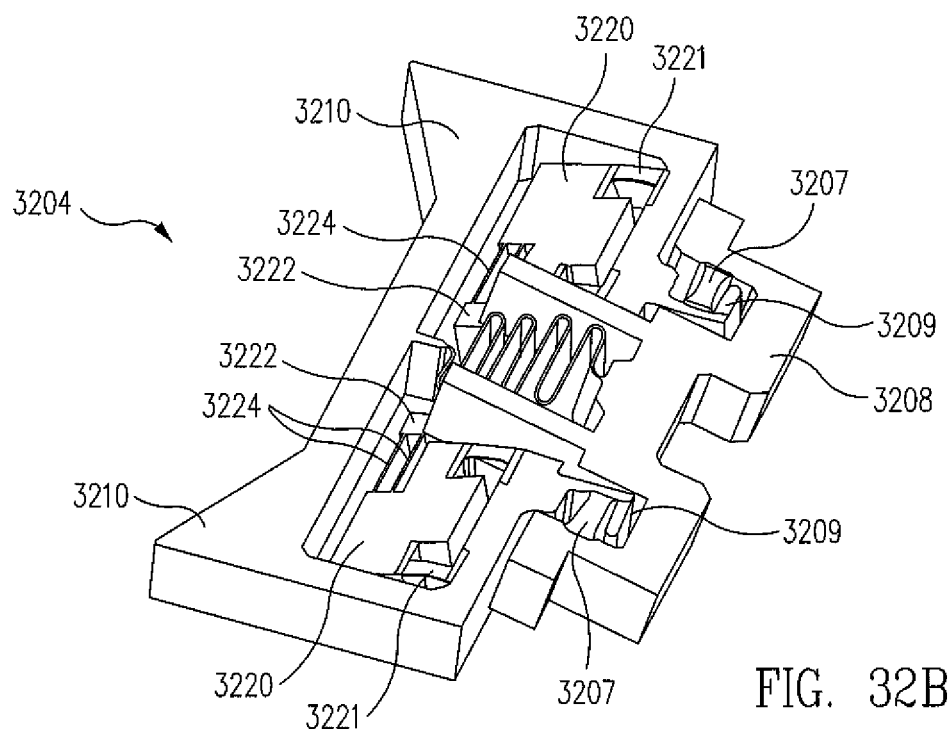

FIGS. 30A-30C are partial schematic side elevation views of an example rotational deployment latching mechanism for an actuator device 2600 in accordance with the present disclosure, respectively showing successive steps involved in the deployment and latching thereof. FIGS. 32A and 32B are, respectively, a partial top plan view of an actuator incorporating the example rotational deployment latching mechanism of FIGS. 30A-30C, showing the actuator prior to deployment, and a partial upper left side perspective view of the actuator and latching mechanism of FIG. 32A, showing the actuator after the deployment and latching thereof.

Referring first to FIGS. 32A and 32B, an example actuator 3204 is illustrated in which a moving frame and its associated moving actuator teeth have been omitted for simplicity of illustration. As shown in FIG. 32A, the actuator 3204 comprises an outer frame 3208 and a fixed frame 3210 coupled to the outer frame 3208 by a plurality of outer hinging flexures 3207, as in some of the embodiments described above. Additionally, a bilaterally symmetrical pair of latch masses 3220 are each coupled to the fixed frame 3210 by a plurality of deployment flexures 3221. A bilaterally symmetrical pair of latch blocks 3222 are each coupled to a corresponding one of the latch masses 3220 by one or more latch block flexures 3224. The latch block flexures 3224 are configured to be relatively stiff in a direction normal to the plane of the actuator 3204, but are relatively compliant in a direction parallel that plane. A bilaterally symmetrical pair of latch feet 3226 project radially forward from the outer frame 3208 such that respective ends of the latch feet 3226 are spaced closely adjacent to corresponding ones of the latch blocks 3222. In some embodiments, a plurality of deployment feet 3209 of the type discussed above in connection with FIGS. 29A and 29B can be disposed on the fixed frame 3210.

Referring now to FIGS. 30A-30C, wherein the foregoing latching features are referred to by like reference numbers, as illustrated schematically in FIG. 30A, as the latch masses 3020 are depressed to rotate downwardly in the direction of the arrow 3028 about a hinge 3021 defined by the deployment flexures (not seen in FIGS. 30A-30C), each of the latch blocks 3022 first makes contact with, then slides down against the opposing face of the corresponding latch foot 3226, causing the latch block 3022 and associated latch block flexures (not seen in FIGS. 30A-30C) to resiliently deflect laterally in the direction of the arrow 3030, as illustrated in FIG. 30B. As illustrated in FIG. 30C, this downward rotation is continued until the upper surface of each latch block 3022 is disposed below the lower surface of the corresponding latch foot 3226, whereupon, the lateral tension built up in the latch block flexures causes the latch block 3022 to spring back laterally in the direction of the arrow 3030 to a position disposed below the lower surface of the corresponding latch foot 3226, thereby latching the latch masses 3020, and hence, the fixed frame (not seen in FIGS. 30A-30C) coupled thereto, at a downward angular position relative to the latch feet 3226 and the fixed frame (not seen in FIGS. 30A 30C).

This "over-center" latching technique is illustrated in the perspective view of FIG. 32B, in which the latch masses 3220 and associated latch blocks 3222 are shown downwardly deployed, with the latch blocks 3222 respectively tucked below the lower surface of corresponding ones of the latching feet 3226 and held there resiliently by the latch block flexures 3224, thereby preventing rotation of the latch blocks 3222 back to their original in-plane positions. The rotated position of the latch masses 3220 causes a corresponding torque to be applied to the fixed frame 3210 by the deployment hinges 3221, which in turn, causes the fixed frame 3210 to rotate downward about the outer hinging flexures 3207 until the deployment feet 3209 contact the outer frame 3208. This precisely sets the angular deployment position of the fixed frame 3210 at −θ, at which point, the deployment feet 3209 can be permanently bonded in place, as discussed above in connection with FIGS. 29A and 29B.

Figure 33:
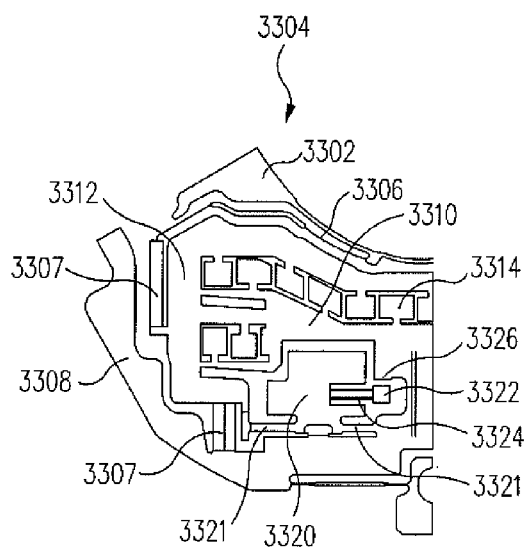
FIG. 33 is a partial top plan view of an individual actuator having a rotational deployment latching mechanism in accordance with that of FIGS. 29A-29C, showing the actuator before deployment.
Figure 33A:
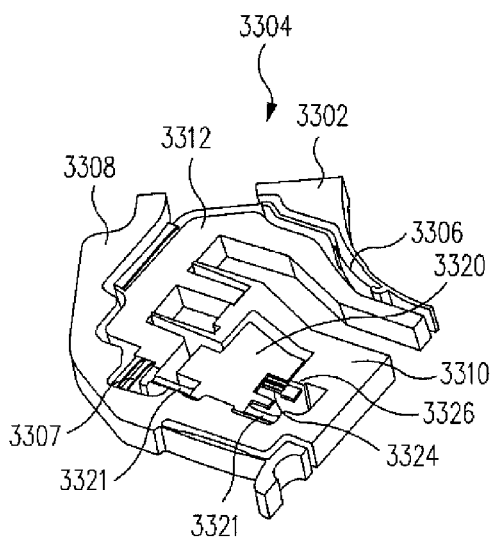
FIGS. 33A-33C are partial upper right side perspective views of the actuator and latching mechanism of FIG. 33, respectively showing successive steps involved in the deployment and latching thereof
Figure 33B:
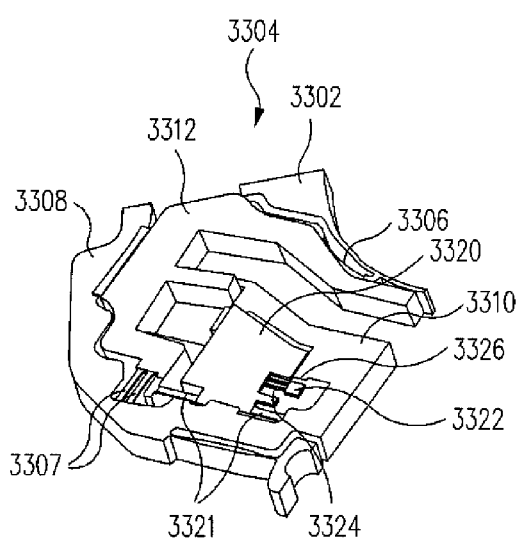
Figure 33C:
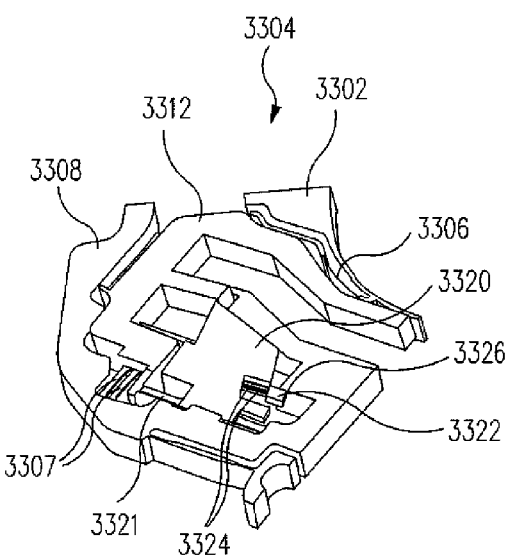

An alternative embodiment of the foregoing "over-center" latching technique is illustrated in FIGS. 33-33C and discussed below in connection with FIGS. 31A-31C. Referring initially to FIG. 33, a left-half portion of an actuator 3304 is shown in plan view. The actuator 3304 comprises an outer frame 3308, a fixed frame 3310 coupled to the outer frame 3308, and a moving frame 3312 coupled to the outer frame by a plurality of outer hinging flexures 3307. Additionally, a latch mass 3320 is coupled to the moving frame 3312 by a plurality of deployment flexures 3321. A latch block 3322 is coupled to the latch mass 3320 by one or more latch block flexures 3324. As in the previous embodiment, the latch block flexures 3324 are configured to be relatively stiff in a direction normal to the plane of the actuator 3304, but are relatively compliant in a direction parallel that plane. A latch foot 3326 projects rearwardly from the fixed frame 3310 such that the outward end of the latch foot 3326 is spaced closely adjacent to the latch block 3322. It should be understood that the foregoing description applies to the left side of the actuator 3304, and that a mirror image of the foregoing features are present on the right side thereof, such that the features are generally present in bilaterally symmetrical pairs.

Figure 31A:
FIGS. 31A-31C are partial schematic side elevation views of another example rotational deployment latching mechanism of an actuator device in accordance with the present disclosure, respectively showing successive steps involved in the deployment thereof and latching thereof.
Figure 31B:
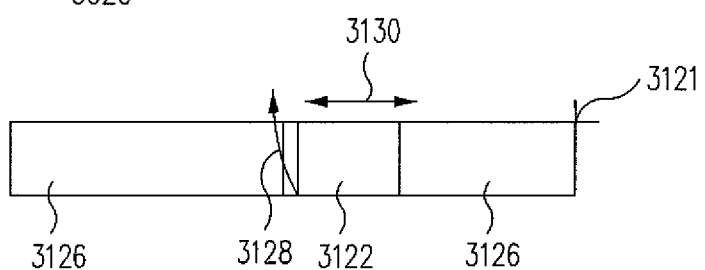
Figure 31C:
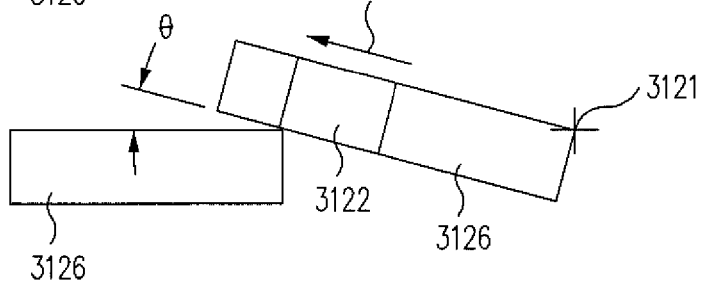

Referring now to FIGS. 31A-31C, wherein the foregoing latching features are referred to by like reference numbers, as illustrated schematically in FIG. 31A, as the latch mass 3120 is raised so as to rotate upwardly in the direction of the arrow 3128 about a hinge line 3121 defined by the deployment flexures (not seen in FIGS. 31A-31C), the latch block 3122 first makes contact with, then slides up against the opposing face of the adjacent latch foot 3126, causing the latch block 3122 and associated latch block flexures (not seen in FIGS. 31A-31C) to resiliently deflect laterally in the direction of the arrow 3130, as illustrated in FIG. 31B. As illustrated in FIG. 31C, this upward rotation is continued until the upper surface of the latch block 3122 is disposed above the upper surface of the latch foot 3126, whereupon, the lateral tension built up in the latch block flexures causes the latch block 3122 to spring back laterally in the direction of the arrow 3130 to a position disposed above the upper surface of the latch foot 3126, thereby latching the latch mass 3120, and hence, the moving frame coupled thereto (not seen in FIGS. 31A-31C), at a upward angular position relative to the latch feet 3126 and the fixed frame (not seen in FIGS. 6A-6C).

This alternative over-center latching technique is illustrated sequentially in the perspective views of FIG. 33A-33C. Thus, in FIGS. 33 and 33A, the actuator 3304 is shown prior to deployment, with the latch block 3322 and latch foot 3326 disposed immediately adjacent to and spaced slightly apart from one another. In FIG. 33B, the latch mass 3320 is shown rotated slightly upward about the deployment hinges 3321, causing the latch block 3322 to engage and slide upward against the opposing face of the latch foot 3326 and, together with the latch flexures 3324, to move laterally in the manner discussed above in connection with FIG. 31B. In FIG. 33C, the actuator 3304 is shown fully deployed, with the latch block 3322 disposed above the upper surface of the latch foot 3326 and retained there by the latch block flexures 3324, thereby preventing downward rotation of the latch block 3322 back to its original in-plane positions. The rotated position of the latch mass 3320 causes a corresponding torque to be applied to the moving frame 3312 by the deployment hinges 3321, which in turn, causes the moving frame 3312 to rotate upward about the outer hinging flexures 3307 until a torsional equilibrium is reached. This sets the nominal angle of the moving frame 3312 at +θ, and thus, the +Z height of the stage 3302 above the plane of the actuator device 3300.

Figure 34:
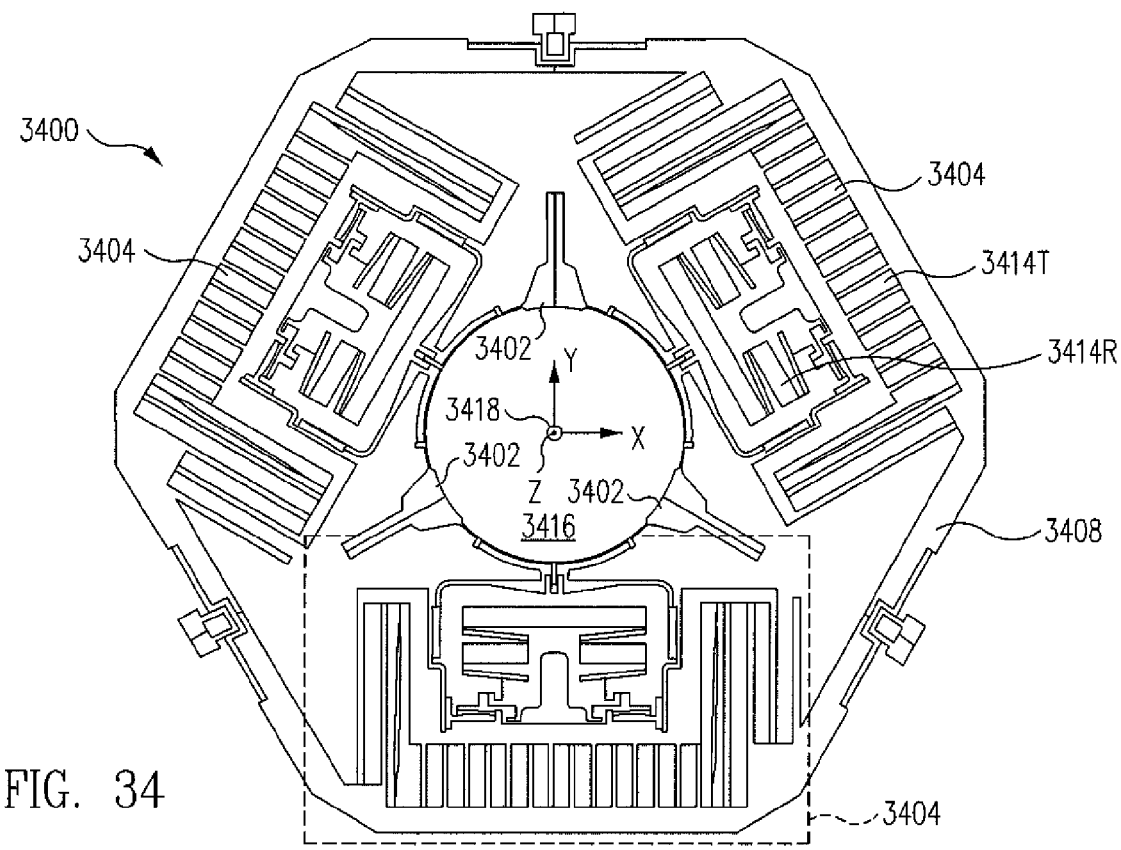
FIG. 34 is a plan view of an example embodiment of another actuator device having both in-plane and out-of-plane actuation capabilities in accordance with the present disclosure.
Figure 35:
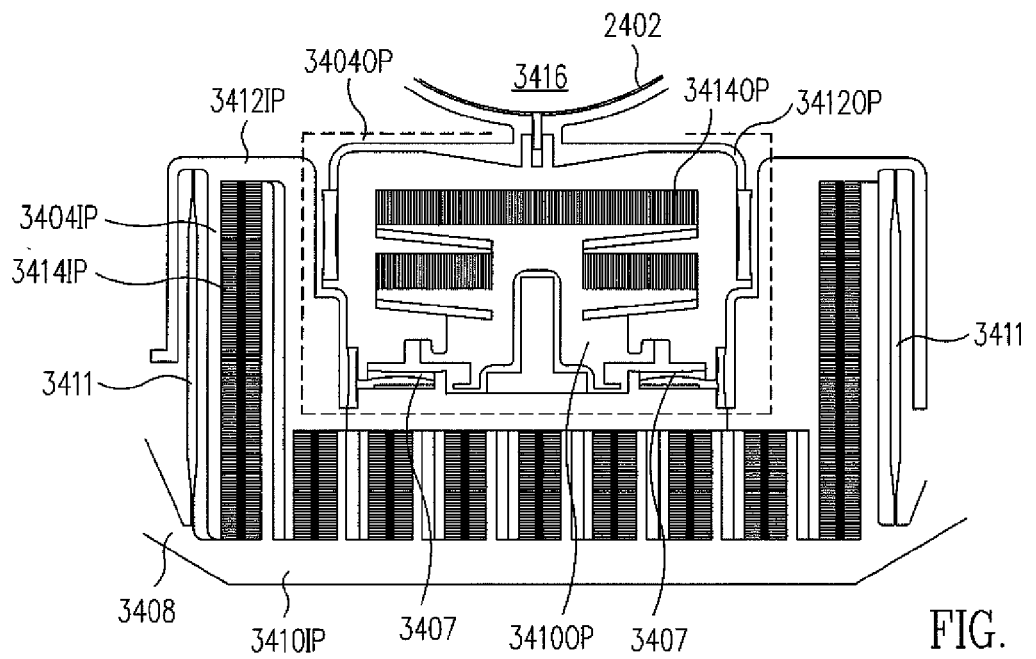
FIG. 35 is a partial enlarged plan view of an actuator of the actuator device of FIG. 34.

Another actuator device 3400 in accordance with the present disclosure is illustrated in FIG. 34 and described in more detail in commonly owned U.S. patent application Ser. No. 13/247,898, filed Sep. 28, 2011 and incorporated herein by reference. FIG. 35 is an enlarged partial plan view of the actuator 3404 of the actuator device 3400, shown bounded by the dashed lines in FIG. 34.

As can be seen in FIGS. 34 and 35, similar to those described above, the actuator device 3400 comprises a substantially planar structure having a stage 3402 resiliently supported for both in-plane and out-of-plane movement relative to a plane of the device 3400. An actuator 3404 is coupled to an outer periphery of the stage 3402. As illustrated in FIG. 35, the actuator 3404 comprises an out-of-plane portion 3404 OP that is operable to apply a force acting perpendicular to the plane of the device and the stage 3402 when actuated, and includes an out-of-plane fixed frame 3410 OP and an out-of-plane moving frame 3412 OP coupled to the stage 3402 and resiliently supported by flexures 3421 for rotational movement relative to the out-of-plane fixed frame 3410 OT.

The actuator 3404 also an in-plane portion 3404 IP that is operable to apply a force acting in the plane of the device 3400 and tangentially to the stage 3402 when actuated. The in-plane portion 3404 IP includes an in-plane fixed frame 3410 IP and an in-plane moving frame 3412 IP coupled to the out-of-plane fixed frame 3410 OP and resiliently supported for translational movement relative to the in-plane fixed frame 3410 IP. As above, an outer frame 3408 can surround and support the stage 3402 and the actuator 3404, and the fixed frame 3410 IP of the in-plane portion 3404 IP of the actuator 3400 can be coupled to the outer frame 3408.

As above, in some embodiments of the actuator device 3400, it may be desirable to deploy one, the other or both of the in-plane and out-of-plane portions 3404 IP and 3404 OP of the actuator 3404 prior to using the actuator device 3400. As described above, this can be effected by rotating the out-of-plane fixed frame 3410 OP or the out-of-plane moving frame 3412 OP to a deployed position that is disposed at a selected angular position θ relative to the other out-of-plane frame, translating the in-plane moving frame 3412 IP to a deployed position that is coplanar with and spaced a selected distance apart from the in-plane fixed frame 3410 IP, and then fixing the deployed out-of-plane and in-plane frames 3410 OP or 3412 OP and 3412IP at their respective deployed positions.

As those of some skill in this art will by now appreciate, and depending on the particular application at hand, many modifications, substitutions and variations can be made in and to the materials, apparatus, configurations and methods of manufacture and deployment of the actuator devices of the present disclosure without departing from the spirit and scope thereof, and in light this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method for making an actuator device, the method comprising:
   forming a substantially planar structure having:
      a stage resiliently supported for movement within a plane of the structure,
      an actuator coupled to an outer periphery of the stage and operable to apply a force acting in the plane and tangentially to the stage when actuated, the actuator including a fixed frame and a moving frame resiliently supported for reciprocal movement relative to the fixed frame by a motion control flexure, and an outer frame surrounding and supporting the stage and the actuator;

moving either the moving frame or the fixed frame as a deployed frame to a deployed position that is coplanar with, parallel to and spaced apart from the other of the moving frame or the fixed frame at a selected distance; and fixing the deployed frame at the deployed position for substantially rectilinear movement toward and away from the other frame.

2. The method of claim 1, wherein the moving comprises:

providing a lower snub having a resilient cantilever thereon, the cantilever having an up-standing post disposed thereon;

forming a pad coupled to the moving frame by a deployment flexure, the pad having a through-opening corresponding in size and configuration to those of the circumferential periphery of the post;

disposing the post in the opening of the pad;

providing an upper snub having a chamfer thereon; and urging the chamfer of the upper snub downward onto the pad such that the pad is urged laterally and causes the deployment flexure to pull the moving frame to the deployed position.

3. The method of claim 1, wherein the moving comprises:

forming an engagement pad coupled to the moving frame by a deployment flexure;

providing a pair of snubs disposed in spaced opposition to each other, each snub having a motion converter disposed bilaterally symmetrical with respect to the ramp of the other, each motion converter having a pusher pad disposed at a distal end thereof;

disposing the engagement pad between the respective pusher pads of the snubs; and urging the snubs toward each other such that the respective motion converters of the snubs rotate away from each other and cause the pusher pads to push the engagement pad laterally and thereby cause the deployment flexure to urge the moving frame to the deployed position.

4. The method of claim 1, wherein the moving comprises:

forming a deployment stage coupled to the moving frame by a deployment flexure, the stage having opposite upper and lower surfaces;

providing a pair of snubs disposed in spaced opposition to each other, each snub having a resilient inclined motion converter disposed bilaterally symmetrical with respect to the motion converter of the other and a pusher pad disposed at a distal end thereof;

placing the lower surface of the deployment stage on an upper surface of the pusher pad of the motion converter of a lower one of the snubs; and urging a lower surface of the pusher pad of the motion converter of an upper one of the stubs downward and into contact with the upper surface of the deployment stage such that the deployment stage is urged laterally by the pusher pads and thereby causes the deployment flexure to urge the moving frame to the deployed position.

5. The method of claim 1, wherein the moving comprises:

forming a deployment pad coupled to the moving frame by a deployment flexure, the pad having a lateral surface;

providing a fixed frame having a component with a positive coefficient of thermal expansion and a lateral surface disposed in opposition to the lateral surface of the deployment pad; and, heating the frame such that at least the component of the frame expands laterally, causing the lateral surface of the frame to contact the opposing lateral surface of the deployment pad and urge the deployment pad laterally, thereby causing the deployment flexure to urge the moving frame to the deployed position.

6. An actuator device made in accordance with the method of claim 1.

7. An electronic device incorporating the actuator device of claim 6.

8. The electronic device of claim 7, wherein the electronic device comprises a camera.

9. A cellular telephone, a personal digital assistant (PDA), a computer or a surveillance system incorporating the camera of claim 8.

10. An actuator device, comprising:

a substantially planar structure having a stage resiliently supported for movement within a plane of the structure, an actuator coupled to an outer periphery of the stage and operable to apply a force acting in the plane and tangentially to the stage when actuated, the actuator including a fixed frame and a moving frame resiliently supported for reciprocal movement relative to the fixed frame by a motion control flexure, and an outer frame surrounding and supporting the stage and the actuator, wherein either the moving frame or the fixed frame is a deployed frame that is disposed at a deployed position that is coplanar with, parallel to and spaced apart from the other of the moving frame or the fixed frame at a selected distance, and the frame is fixed at the deployed position for substantially rectilinear movement toward and away from the other frame.

11. An electronic device incorporating the actuator device of claim 10.

12. The electronic device of claim 11, wherein the electronic device comprises a camera.

13. A cellular telephone, a personal digital assistant (FDA), a computer or a surveillance system incorporating the camera of claim 12.

14. A method for making an actuator device, the method comprising:

forming a substantially planar structure having a stage resiliently supported for both in-plane and out-of-plane movement relative to a plane of the device, an actuator coupled to an outer periphery of the stage, the actuator comprising an out-of-plane portion operable to apply a force acting perpendicular to the plane of the device and the stage when actuated, the out-of-plane portion including an out-of-plane fixed frame and an out-of-plane moving frame coupled to the stage and resiliently supported for rotational movement relative to the out-of-plane fixed frame, an in-plane portion operable to apply a force acting in the plane of the device and tangentially to the stage when actuated, the in-plane portion including an in-plane fixed frame and an in-plane moving frame coupled to the out-of-plane fixed frame and resiliently supported for translational movement relative to the in-plane fixed frame, and an outer frame surrounding and supporting the stage and the actuator;

rotating either the out-of-plane fixed frame or the out-of-plane moving frame to a deployed position disposed at a selected angular position relative to the other out-of-plane frame;

translating either the in-plane moving frame or the in-plane fixed frame to a deployed position that is coplanar with and spaced a selected distance apart from the other in-plane frame; and fixing the deployed out-of-plane frame and the deployed in-plane frame at their respective deployed positions.

15. An electronic device incorporating the actuator device of claim 14.

16. The electronic device of claim 15, wherein the electronic device comprises a camera.

17. A cellular telephone, a personal digital assistant (PDA), a computer or a surveillance system incorporating the camera of claim 16.

18. An actuator device, comprising:
a substantially planar structure having
a stage resiliently supported for both in-plane and out-of-plane movement relative to a plane of the device; and
an actuator coupled to an outer periphery of the stage, the actuator comprising
an out-of-plane portion operable to apply a force acting perpendicular to the plane of the device and the stage when actuated, the out-of-plane portion including an out-of-plane fixed frame and an out-of-plane moving frame coupled to the stage and resiliently supported for rotational movement relative to the out-of-plane fixed frame,
an in-plane portion operable to apply a force acting in the plane of the device and tangentially to the stage when actuated, the in-plane portion including an in-plane fixed frame and an in-plane moving frame coupled to the out-of-plane fixed frame and resiliently supported for translational movement relative to the in-plane fixed frame, and
an outer frame surrounding and supporting the stage and the actuator, wherein
either the out-of-plane fixed frame or the out-of-plane moving frame is rotated to a deployed position disposed at a selected angular position relative to the other out-of-plane frame,
either the in-plane moving frame or the in-plane fixed frame is translated to a deployed position that is coplanar with and spaced a selected distance apart from the other in-plane frame, and
the deployed out-of-plane frame and the deployed in-plane frame are fixed at their respective deployed positions.

19. An electronic device incorporating the actuator device of claim 18.

20. The electronic device of claim 19, wherein the electronic device comprises a camera.

21. A cellular telephone, a personal digital assistant (FDA), a computer or a surveillance system incorporating the camera of claim 20.

\* \* \* \* \*